United States Patent
Suzuki et al.

(10) Patent No.: US 11,121,160 B2
(45) Date of Patent: Sep. 14, 2021

(54) PHOTOELECTRIC CONVERSION APPARATUS AND EQUIPMENT COMPRISING A LIGHT SHIELDING PART IN A LIGHT RECEIVING REGION AND A LIGHT SHIELDING FILM IN A LIGHT SHIELDED REGION

(71) Applicant: CANON KABUSHIKI KAISHA, Tokyo (JP)

(72) Inventors: Sho Suzuki, Machida (JP); Takehito Okabe, Yokohama (JP); Mitsuhiro Yomori, Tama (JP); Takuya Hara, Yokohama (JP); Keita Torii, Naka-gun (JP); Yukinobu Suzuki, Koza-gun (JP); Tomoyuki Tezuka, Sagamihara (JP); Norihiko Nakata, Hiratsuka (JP); Daichi Seto, Yokohama (JP); Kenji Togo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/601,888

(22) Filed: Oct. 15, 2019

(65) Prior Publication Data
US 2020/0127031 A1    Apr. 23, 2020

(30) Foreign Application Priority Data

Oct. 17, 2018    (JP) .............................. JP2018-196075
Jul. 5, 2019    (JP) .............................. JP2019-126402

(51) Int. Cl.
*H01L 27/146*    (2006.01)

(52) U.S. Cl.
CPC .. *H01L 27/14623* (2013.01); *H01L 27/14627* (2013.01); *H01L 27/14636* (2013.01); *H01L 27/14643* (2013.01); *H01L 27/14692* (2013.01)

(58) Field of Classification Search
CPC ......... H01L 27/14623; H01L 27/14627; H01L 27/14636; H01L 27/14605; H01L 27/14634; H01L 27/1469
(Continued)

(56) References Cited

U.S. PATENT DOCUMENTS 7,382,011 B2    6/2008  Noda et al.
7,679,117 B2    3/2010  Noda et al.
(Continued)

FOREIGN PATENT DOCUMENTS

JP    2005-294647 A    10/2005
JP    2007-013061 A    1/2007
(Continued)

OTHER PUBLICATIONS

U.S. Appl. No. 16/722,850, filed Dec. 20, 2019 (First Named Inventor: Daichi Seto).
(Continued)

*Primary Examiner* — Que Tan Le
(74) *Attorney, Agent, or Firm* — Venable LLP

(57) ABSTRACT

Photoelectric conversion apparatus includes semiconductor layer having photoelectric converters in light-receiving region and photoelectric converters in light-shielded region, light-shielding part arranged above the semiconductor layer in the light-receiving region to surround light paths of the photoelectric converters in the light-receiving region, and light-shielding film arranged above the semiconductor layer in the light-shielded region to cover the photoelectric converters in the light-shielded region. The light-shielding part includes lower and upper ends. The light-shielding film includes lower and upper surfaces. Distance between the upper end and the semiconductor layer is larger than that between the upper surface and the semiconductor layer. Distance between the lower end and the semiconductor layer
(Continued)

is smaller than that between the upper surface and the semiconductor layer and is larger than that between the lower surface and the semiconductor layer.

25 Claims, 22 Drawing Sheets

(58) Field of Classification Search
USPC .................................. 250/208.1, 214 R, 239
See application file for complete search history.

(56) References Cited

U.S. PATENT DOCUMENTS

| | | | |
|---|---|---|---|
| 7,993,951 B2 | 8/2011 | Okabe et al. | |
| 8,492,864 B2 | 7/2013 | Watanabe | |
| 8,729,450 B2 | 5/2014 | Yoshitsugu | |
| 8,907,262 B2 * | 12/2014 | Yamaguchi | H01L 27/14607 250/208.1 |
| 9,006,018 B2 | 4/2015 | Watanabe | |
| 9,653,502 B2 | 5/2017 | Yoshitsugu | |
| 9,923,023 B2 | 3/2018 | Ishino et al. | |
| 10,008,528 B2 | 6/2018 | Ikakura et al. | |
| 10,204,943 B2 | 2/2019 | Suzuki et al. | |
| 10,319,765 B2 | 6/2019 | Kato et al. | |
| 2006/0060899 A1 | 3/2006 | Hong et al. | |
| 2007/0210395 A1 | 9/2007 | Maruyama et al. | |
| 2009/0184386 A1 | 7/2009 | Kobayashi et al. | |
| 2009/0189236 A1 | 7/2009 | Hayashi et al. | |
| 2010/0001178 A1 | 1/2010 | Koshiba | |
| 2010/0201834 A1 | 8/2010 | Maruyama et al. | |
| 2010/0245637 A1 | 9/2010 | Itonaga | |
| 2011/0025872 A1 | 2/2011 | Oshiyama et al. | |
| 2011/0175187 A1 | 7/2011 | Ueno et al. | |
| 2011/0227182 A1 | 9/2011 | Aoki | |
| 2011/0241148 A1 | 10/2011 | Hiyama et al. | |
| 2012/0188431 A1 | 7/2012 | Takimoto | |
| 2013/0001724 A1 | 1/2013 | Masuda | |
| 2013/0214371 A1 | 8/2013 | Asatsuma et al. | |
| 2014/0044390 A1 | 2/2014 | Naruse | |
| 2014/0054662 A1 | 2/2014 | Yanagita et al. | |
| 2014/0071244 A1 | 3/2014 | Hirota | |
| 2014/0346628 A1 | 11/2014 | Okazaki | |
| 2015/0091122 A1 | 4/2015 | Okazaki et al. | |
| 2015/0264233 A1 | 9/2015 | Chien et al. | |
| 2015/0325606 A1 | 11/2015 | Togashi et al. | |
| 2016/0013233 A1 | 1/2016 | Noudo et al. | |
| 2017/0251156 A1 | 8/2017 | Kudoh et al. | |
| 2017/0287956 A1 | 10/2017 | Tezuka | |
| 2017/0338265 A1 | 11/2017 | Yoshiba et al. | |
| 2018/0286904 A1 | 10/2018 | Tazoe et al. | |
| 2018/0374886 A1 | 12/2018 | Iwata et al. | |
| 2019/0259801 A1 | 8/2019 | Seto et al. | |
| 2019/0267421 A1 | 8/2019 | Suzuki et al. | |

FOREIGN PATENT DOCUMENTS

| | | |
|---|---|---|
| JP | 2007-141873 A | 6/2007 |
| JP | 2009-272747 A | 11/2009 |
| JP | 2009-283482 A | 12/2009 |
| JP | 2011-035204 A | 2/2011 |
| JP | 2011-082386 A | 4/2011 |
| JP | 2012-084693 A | 4/2012 |
| JP | 2012-124213 A | 6/2012 |
| JP | 2012-191005 A | 10/2012 |
| JP | 2013-012506 A | 1/2013 |
| JP | 2014-036037 A | 2/2014 |
| JP | 2016-062998 A | 4/2016 |
| JP | 2016-167773 A | 9/2016 |
| JP | 2016-219551 A | 12/2016 |
| WO | 2013/150839 A1 | 10/2013 |
| WO | 2016/114154 A1 | 7/2016 |

OTHER PUBLICATIONS

U.S. Appl. No. 16/600,753, filed Oct. 14, 2019 (First Named Inventor: Toshiyuki Ogawa).
U.S. Appl. No. 16/659,765, filed Oct. 22, 2019 (First Named Inventor: Keita Torii).
European Search Report dated Feb. 27, 2020, in European Patent Application No. 19203195.3.
Office Action dated Feb. 15, 2021, in Japanese Patent Application No. 2019-126402.
Office Action dated Mar. 5, 2021, in Japanese Patent Application No. 2019-126403.

* cited by examiner

PHOTOELECTRIC CONVERSION APPARATUS AND EQUIPMENT COMPRISING A LIGHT SHIELDING PART IN A LIGHT RECEIVING REGION AND A LIGHT SHIELDING FILM IN A LIGHT SHIELDED REGION

BACKGROUND OF THE INVENTION

Field of the Invention

The present invention relates to a photoelectric conversion apparatus and an equipment.

Description of the Related Art

Japanese Patent Laid-Open No. 2014-36037 discloses a photoelectric conversion apparatus that prevents light from entering an adjacent pixel by providing a light-shielding part in a light-receiving region where pixels for receiving light from an object are arranged. The photoelectric conversion apparatus includes a pixel region including the light-receiving region and an OB pixel region. The photoelectric conversion apparatus includes, as components common to the light-receiving region and the OB pixel region, a plurality of light-receiving portions arranged in a semiconductor layer, an insulator arranged above the semiconductor layer, and a plurality of light guides arranged above the plurality of light-receiving portions to be surrounded by the insulator. Furthermore, the photoelectric conversion apparatus includes, as components common to the light-receiving region and the OB pixel region, a connecting member that interconnects the plurality of light guides and the first member arranged above the connecting member. The photoelectric conversion apparatus includes, as components arranged only in the light-receiving region, the first lens arranged above the first member, a light-shielding part arranged between the first lens and an insulator, and a color filter and the second lens arranged above the first lens. The photoelectric conversion apparatus includes, as a component arranged only in the OB pixel region, a light-shielding part for the OB pixel region arranged above the first member and the light-shielding part.

In the photoelectric conversion apparatus described in Japanese Patent Laid-Open No. 2014-36037, a light-shielding part is not arranged, in the light-receiving region, at a position higher than the light-shielding part for the OB pixel region. Therefore, light obliquely entering the light-receiving region becomes stray light to enter below the light-shielding part for the OB pixel region, and the light may enter the light-receiving portion in the OB pixel region. Consequently, it may be impossible to correctly detect an optical black level by the light-receiving portion in the OB pixel region.

SUMMARY OF THE INVENTION

The present invention provides a technique advantageous in suppressing stray light.

A first aspect of the present invention provides a photoelectric conversion apparatus including a light-receiving region and a light-shielded region, comprising: a semiconductor layer including a plurality of photoelectric converters provided in the light-receiving region and a plurality of photoelectric converters provided in the light-shielded region; a light-shielding part arranged above the semiconductor layer in the light-receiving region to surround light paths of light beams respectively entering the plurality of photoelectric converters provided in the light-receiving region; and a light-shielding film arranged above the semiconductor layer in the light-shielded region to cover the plurality of photoelectric converters provided in the light-shielded region, wherein the light-shielding part includes a lower end that is an end on a side of the semiconductor layer in a direction perpendicular to a principal surface of the semiconductor layer and an upper end that is an end on an opposite side of the lower end of the light-shielding part in the perpendicular direction, the light-shielding film includes a lower surface that is a surface on the side of the semiconductor layer in the perpendicular direction and an upper surface that is a surface on an opposite side of the semiconductor layer in the perpendicular direction, and the lower surface is along the principal surface of the semiconductor layer to face the plurality of photoelectric converters provided in the light-shielded region, a distance between the upper end of the light-shielding part and the semiconductor layer is larger than a distance between the upper surface of the light-shielding film and the semiconductor layer, and a distance between the lower end of the light-shielding part and the semiconductor layer is smaller than the distance between the upper surface of the light-shielding film and the semiconductor layer, and is larger than a distance between the lower surface of the light-shielding film and the semiconductor layer.

A second aspect of the present invention provides a photoelectric conversion apparatus including a light-receiving region and a light-shielded region, comprising: a semiconductor layer including a plurality of photoelectric converters provided in the light-receiving region and a plurality of photoelectric converters provided in the light-shielded region; a light-shielding part arranged above the semiconductor layer in the light-receiving region to surround light paths of light beams respectively entering the plurality of photoelectric converters provided in the light-receiving region; a light-shielding film arranged above the semiconductor layer in the light-shielded region to cover the plurality of photoelectric converters provided in the light-shielded region; a plurality of light guides arranged in light paths of light beams respectively entering the plurality of photoelectric converters provided in the light-shielded region; and a coupling portion spreading to interconnect the plurality of light guides and extending from the light-receiving region to the light-shielding film, wherein the light-shielding part includes a lower end that is an end on a side of the semiconductor layer in a direction perpendicular to a principal surface of the semiconductor layer and an upper end that is an end on an opposite side of the lower end of the light-shielding part in the perpendicular direction, the light-shielding film includes a lower surface that is a surface on the side of the semiconductor layer in the perpendicular direction and an upper surface that a surface on an opposite side of the semiconductor layer in the perpendicular direction, and the lower surface is along the principal surface of the semiconductor layer to face the plurality of photoelectric converters provided in the light-shielded region, the light-shielding part is arranged above the coupling portion, a distance between the upper end of the light-shielding part and the semiconductor layer is larger than a distance between the upper surface of the light-shielding film and the semiconductor layer, and a distance between the lower end of the light-shielding part and the semiconductor layer is smaller than the distance between the upper surface of the light-shielding film and the semiconductor layer.

A third aspect of the present invention provides a photoelectric conversion apparatus comprising: a semiconductor layer including a plurality of photoelectric converters; a light-shielding part arranged to surround light paths of light beams respectively entering the plurality of photoelectric converters; and a compound film arranged between the semiconductor layer and the light-shielding part and made of a compound containing silicon and nitrogen, the light-shielding part including a lower end that is an end on a side of the semiconductor layer in a direction perpendicular to a principal surface of the semiconductor layer and an upper end that is an end on an opposite side of the lower end of the light-shielding part in the perpendicular direction, and the compound film including a lower surface that is a surface on the side of the semiconductor layer in the perpendicular direction and an upper surface that is a surface on an opposite side of the semiconductor layer in the perpendicular direction, the upper surface of the compound film including a flat portion, wherein a distance between the lower end of the light-shielding part and the semiconductor layer is smaller than a distance between the flat portion of the upper surface of the compound film and the semiconductor layer, and is larger than a distance between the lower surface of the compound film and the semiconductor layer.

A fourth aspect of the present invention provides an equipment comprising: a photoelectric conversion apparatus defined in any one of the first to third aspect of the present invention; and a processor configured to process a signal output from the photoelectric conversion apparatus.

Further features of the present invention will become apparent from the following description of exemplary embodiments with reference to the attached drawings.

DESCRIPTION OF THE EMBODIMENTS

The present invention will be described below with reference to the accompanying drawings by way of exemplary embodiments.

In this specification, "A is higher than B" means that "the distance between A and the principal surface of a semiconductor layer is larger than that between B and the principal surface", and "A is lower than B" means that "the distance between A and the principal surface is smaller than that between B and the principal surface". In this specification, "the lower end of A" indicates "an end on the side of the semiconductor layer out of two ends of A in a direction perpendicular to the principal surface", and "the upper end of A" indicates "an end on the opposite side of the lower end out of the two ends of A in the direction perpendicular to the principal surface". In this specification, "the lower surface of A" indicates "a surface on the side of the semiconductor layer out of two surfaces of A intersecting (or orthogonal to) the direction perpendicular to the principal surface", and "the upper surface of A" indicates "a surface on the opposite side of the lower surface out of the two surfaces of A intersecting (or orthogonal to) the direction perpendicular to the principal surface".

Figure 1:
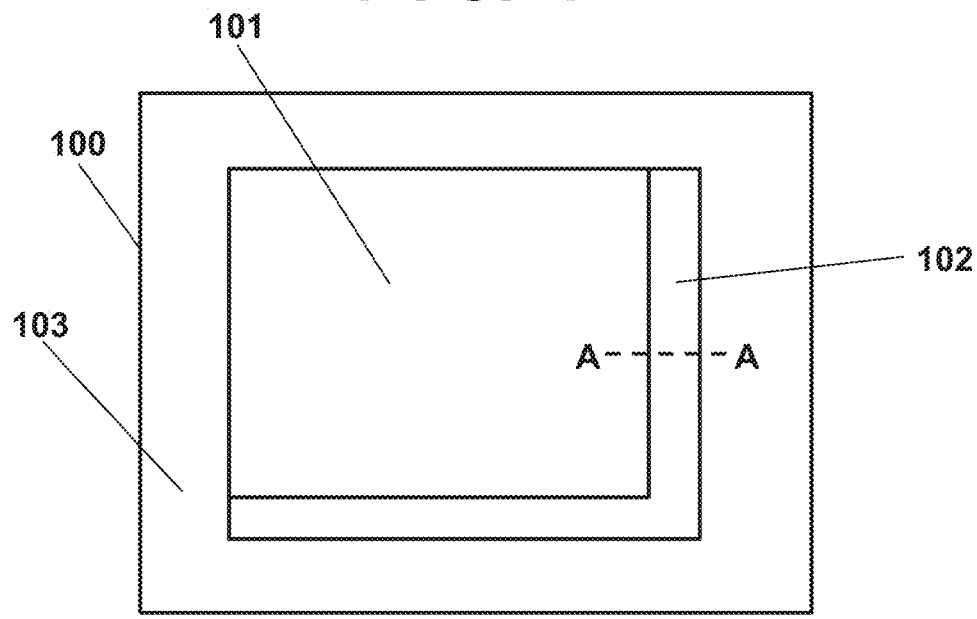
FIG. 1 is a plan view showing the arrangement of a photoelectric conversion apparatus according to the first embodiment of the present invention.

FIG. 1 is a plan view showing the arrangement of a photoelectric conversion apparatus 100 according to the first embodiment of the present invention. The photoelectric conversion apparatus 100 includes a light-receiving pixel region 101, a light-shielded pixel region (OB pixel region) 102, and a peripheral circuit region 103. The light-receiving pixel region 101 is a region where a plurality of photoelectric converters (first photoelectric converters) are arranged to form a plurality of rows and a plurality of columns. In other words, the light-receiving pixel region 101 is a region where a plurality of pixels (first pixels) are arranged to form a plurality of rows and a plurality of columns. Signals of the first photoelectric converters (first pixels) of each column of the light-receiving pixel region 101 are output via a column signal line. The light-shielded pixel region 102 is a region where a plurality of shielded photoelectric converters (second photoelectric converters) are arranged to form a plurality of rows and a plurality of columns. In other words, the light-shielded pixel region 102 is a region where a plurality of shielded pixels (second pixels) are arranged. The plurality of shielded pixels are used to provide an optical black level, and can be called optical black (OB) pixels. A shock-absorbing region including a pixel structure may be included between the light-receiving pixel region 101 and the light-shielded pixel region 102. The pixels in the light-receiving pixel region 101 and those in the light-shielded pixel region 102 include, in addition to the photoelectric converters, circuit elements for outputting, outside the pixels, signals corresponding to charges generated in the photoelectric converters.

The peripheral circuit region 103 can include, for example, a row selection circuit, a readout circuit, and a column selection circuit. The plurality of photoelectric converters arranged in the light-receiving pixel region 101 and the plurality of photoelectric converters arranged in the light-shielded pixel region 102 can be arranged as a whole to form a photoelectric conversion array formed from a plurality of rows and a plurality of columns. The row selection circuit selects a row in the photoelectric conversion array, and drives the photoelectric converters of the selected row. The signals of the photoelectric converters of the row selected by the row selection circuit are output to the readout circuit via the column signal lines. The readout circuit reads out the signals output to the respective column signal lines. The column selection circuit sequentially selects and outputs the plurality of signals read out by the readout circuit from the plurality of column signal lines.

Figure 2:
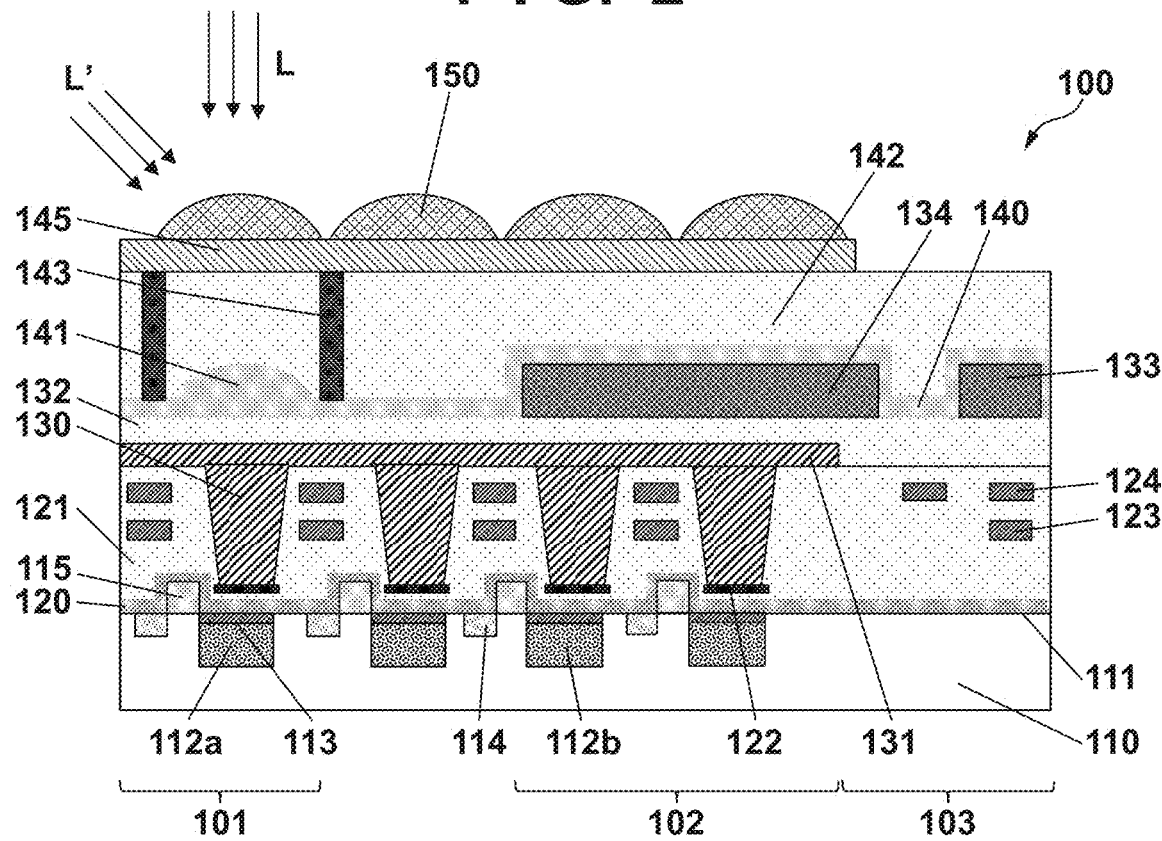
FIG. 2 is a sectional view showing the arrangement of the photoelectric conversion apparatus according to the first embodiment of the present invention.
Figure 3:
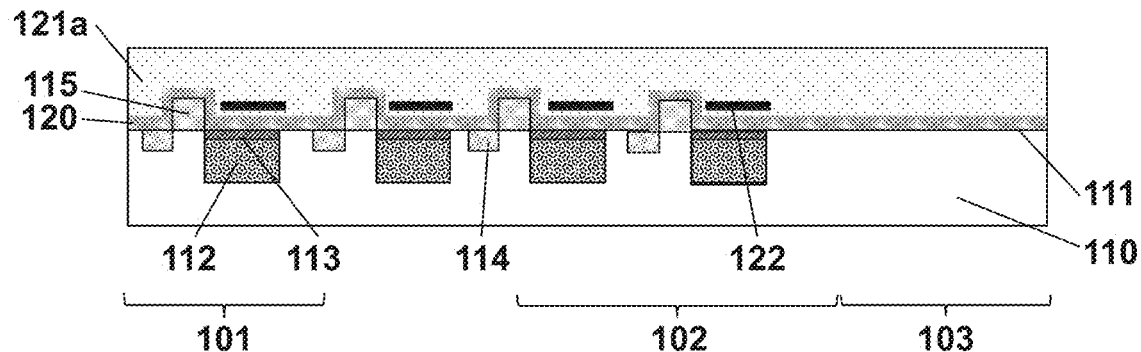
FIG. 3 is a sectional view showing a method of manufacturing the photoelectric conversion apparatus according to the first embodiment of the present invention.
Figure 3:
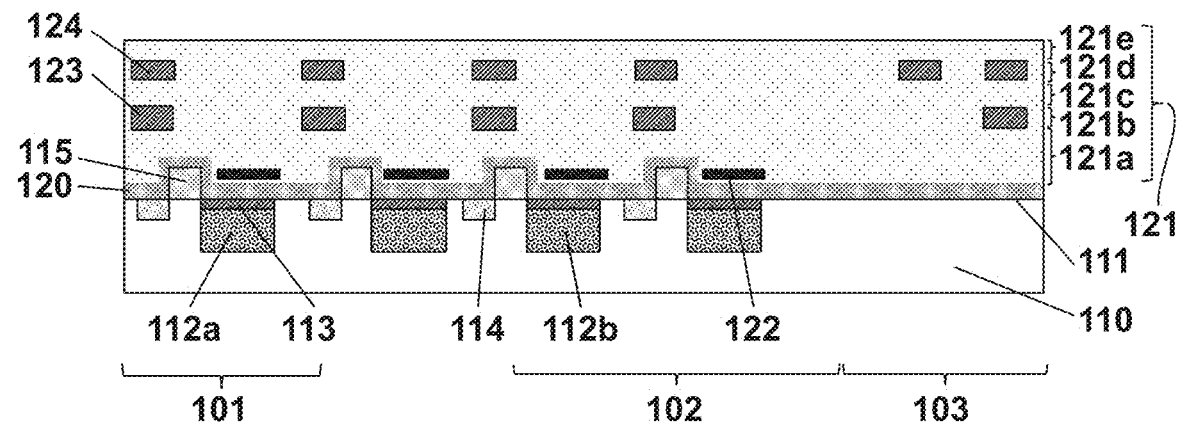
Figure 3:
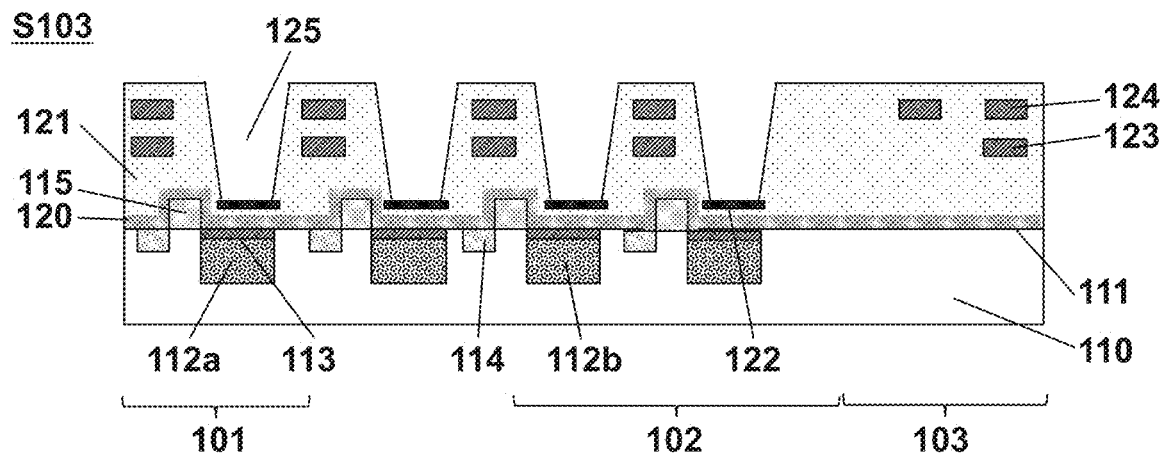
Figure 4:
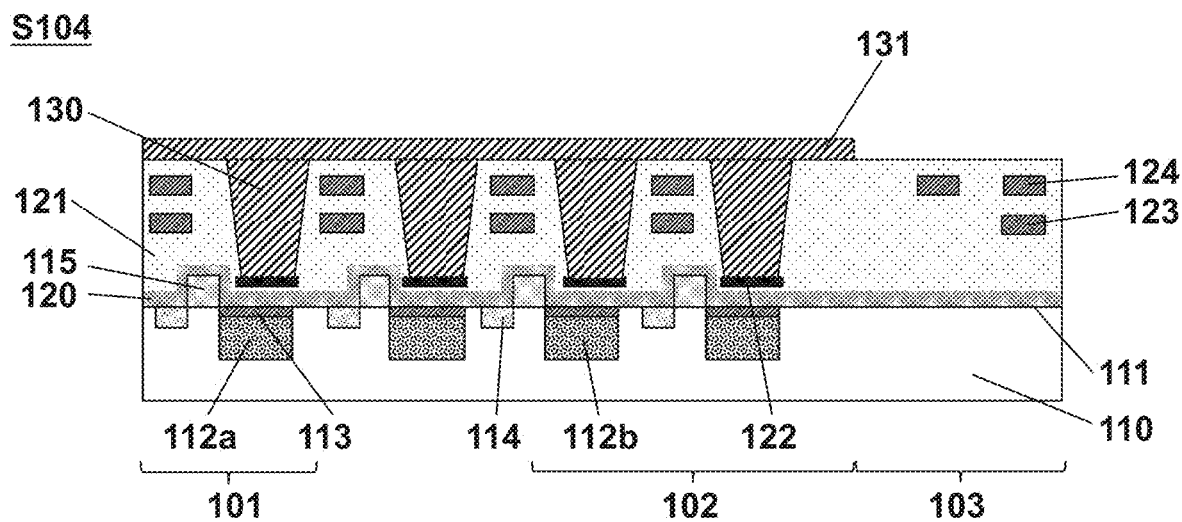
FIG. 4 is a sectional view showing the method of manufacturing the photoelectric conversion apparatus according to the first embodiment of the present invention.
Figure 4:
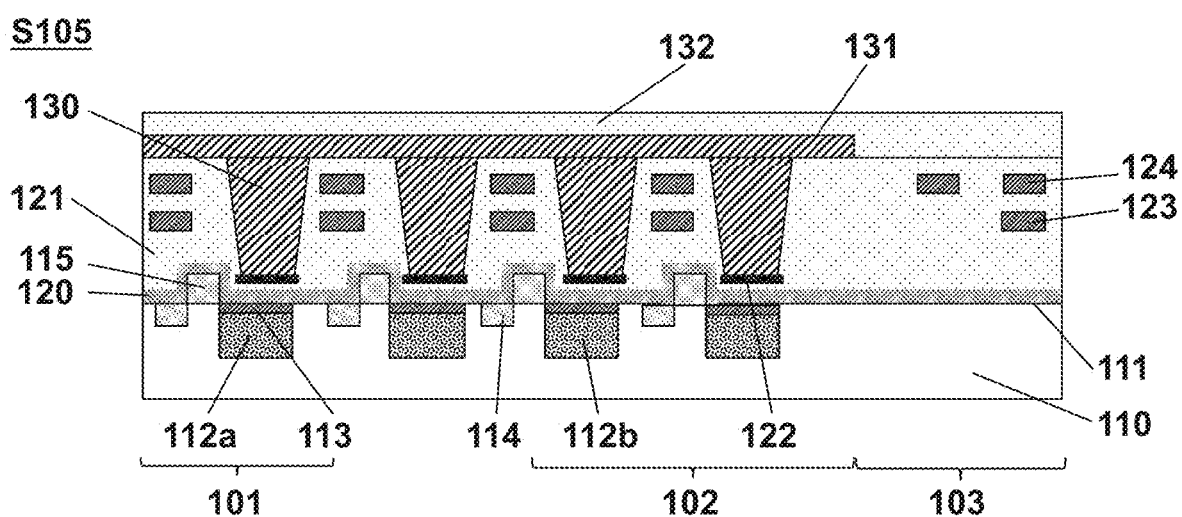
Figure 4:
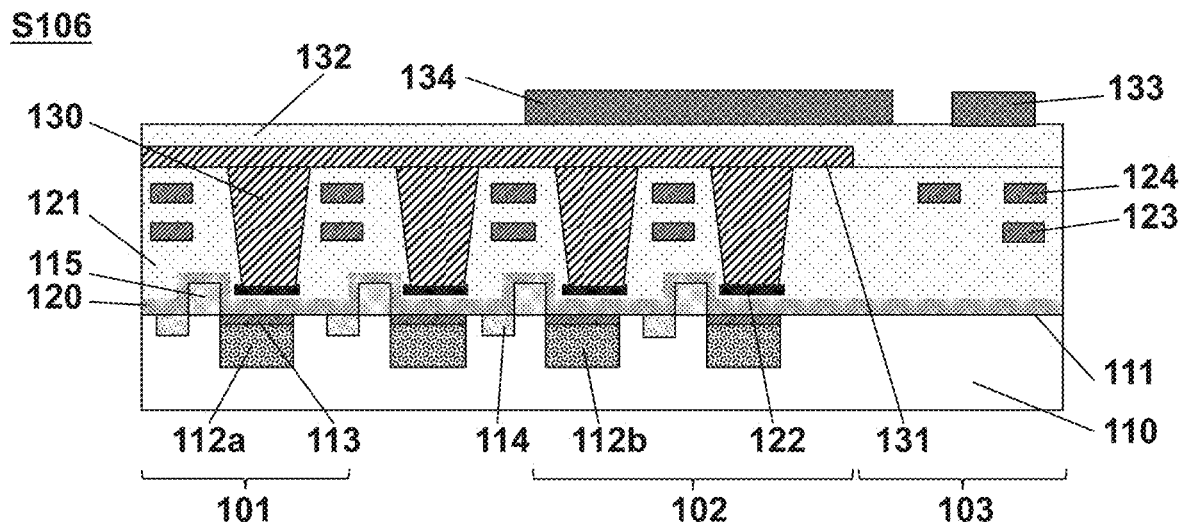
Figure 5:
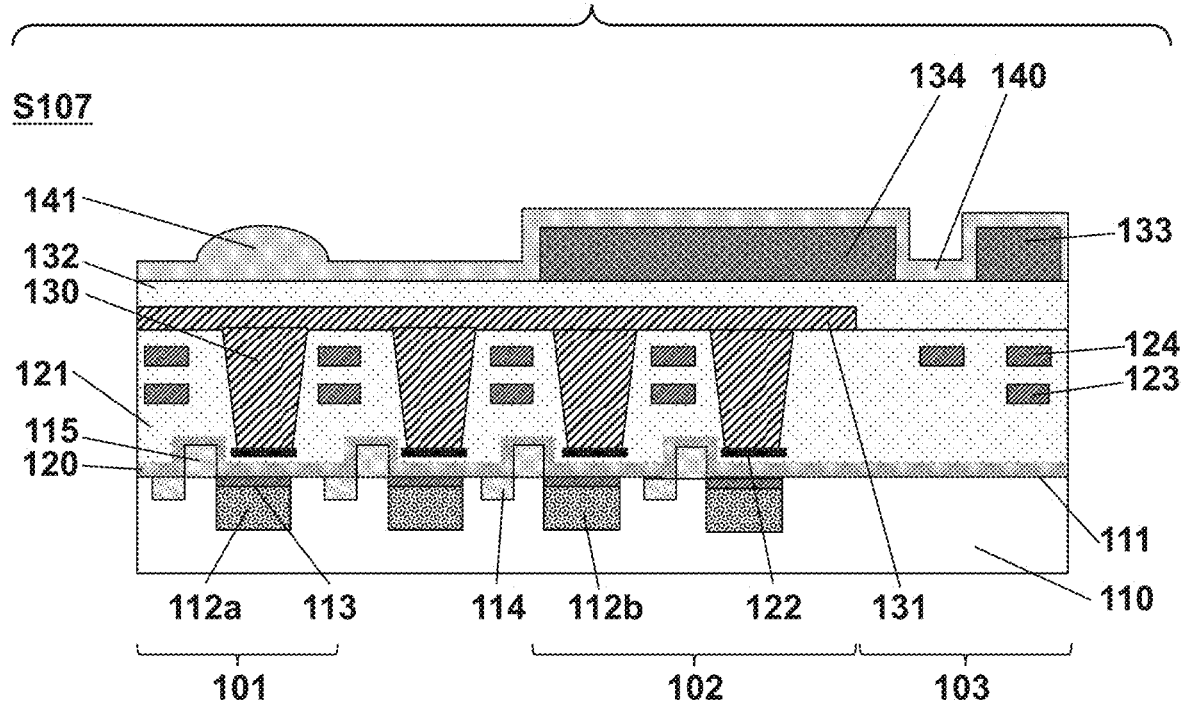
FIG. 5 is a sectional view showing the method of manufacturing the photoelectric conversion apparatus according to the first embodiment of the present invention.
Figure 5:
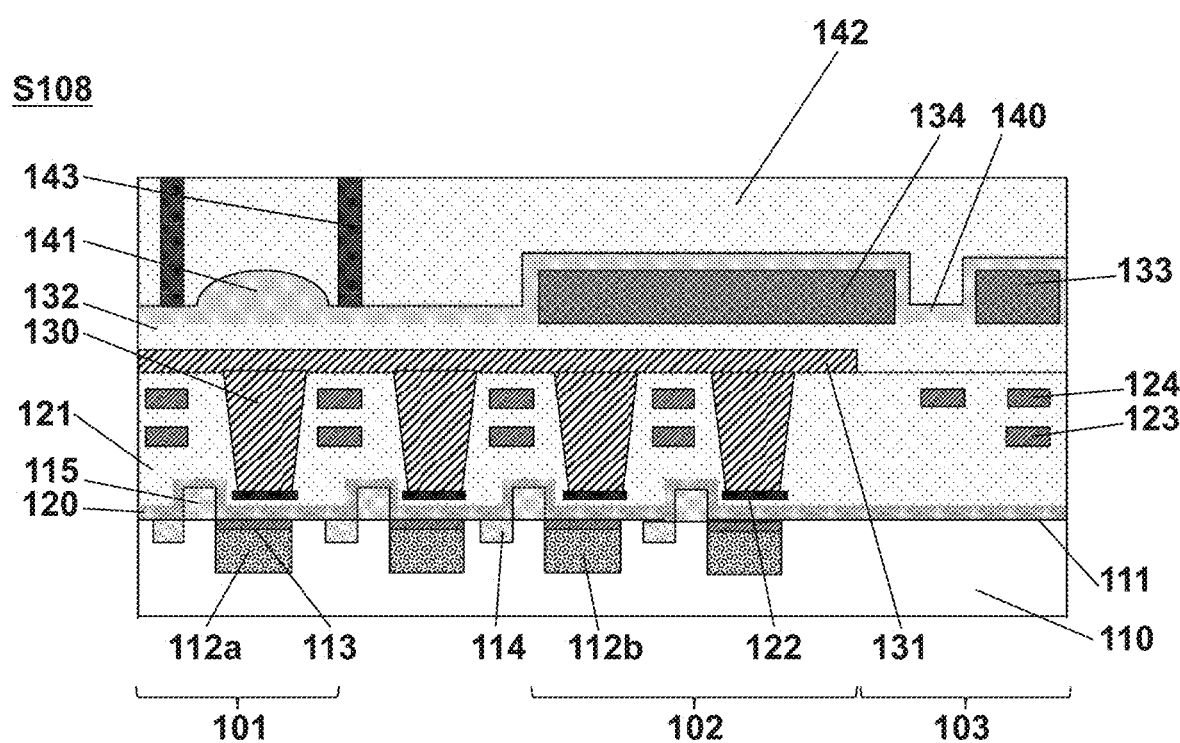
Figure 6:
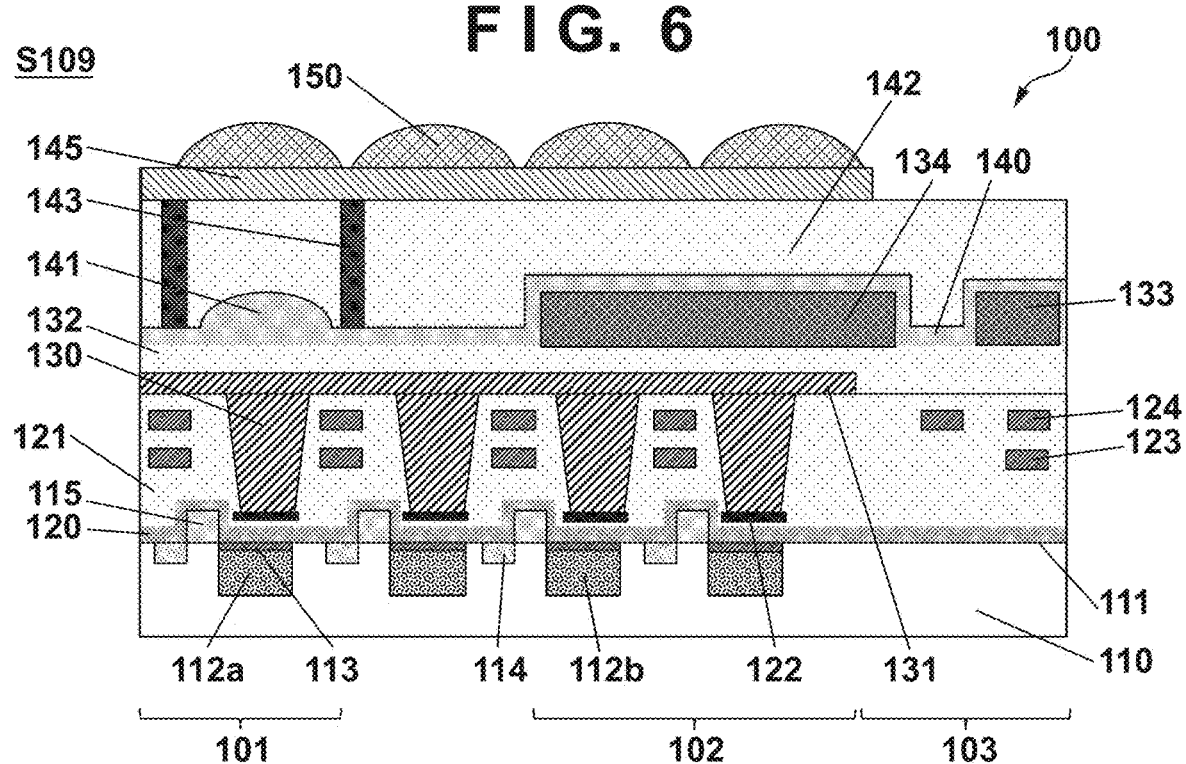
FIG. 6 is a sectional view showing the method of manufacturing the photoelectric conversion apparatus according to the first embodiment of the present invention.

FIG. 2 is a schematic sectional view taken along a line A-A and showing the photoelectric conversion apparatus 100 in FIG. 1. In the following description, the first conductivity type and the second conductivity type will be used as terms to discriminate between an n-type and a p-type. If the first conductivity type is an n-type, the second conductivity type is a p-type, and vice versa. The photoelectric conversion apparatus 100 can include a semiconductor layer 110. The semiconductor layer 110 is, for example, a semiconductor region of the first conductivity type (for example, the n-type), and can be formed by, for example, epitaxial growth. In the semiconductor layer 110, a semiconductor region (only part of it is shown) of the first conductivity type and a semiconductor region (only part of it is shown) of the second conductivity type can be arranged. The semiconductor layer 110 has a principal surface 111. The principal surface 111 can be, for example, an interface between the semiconductor layer 110 and an insulating film (not shown) stacked on the semiconductor layer 110. Light beams enter the semiconductor layer 110 through the principal surface 111. In FIG. 2, a direction in which light beams mainly enter is represented by arrows L.

The semiconductor layer 110 can include a plurality of photoelectric converters (first photoelectric converters) 112a in the light-receiving pixel region 101 and a plurality of photoelectric converters (second photoelectric converters) 112b in the light-shielded pixel region 102. The photoelectric converters 112a and 112b can be semiconductor regions of the first conductivity type, each forming part of a photodiode. Charges generated by photoelectric conversion can be collected by the photoelectric converters 112a and 112b. A semiconductor region 113 of the second conductivity type can be arranged above each of the photoelectric converters 112a and 112b. Each semiconductor region 113 can be arranged to contact the principal surface 111 of the semiconductor layer 110. The semiconductor region 113 may be a region having a charge with the same sign as that of a majority carrier in the second conductivity type.

The semiconductor layer 110 can include floating diffusions (to be referred to as FDs hereinafter) 114. Each FD 114 is a semiconductor region of the first conductivity type. Charges generated by each of the photoelectric converters 112a and 112b are transferred to the corresponding FD 114, and converted into a voltage. Each FD 114 can electrically be connected to an input node of an amplifier (not shown). The amplifier can be provided for each pixel or for every plurality of pixels. Gate electrodes 115 can be arranged on a gate insulating film on the semiconductor layer 110. Each gate electrode 115 arranged above a region between each of the photoelectric converters 112a and 112b and each of the FDs 114 is a transfer gate electrode that controls transfer of charges from the photoelectric converter 112 to the FD 114.

A protection film 120 can be arranged to cover the semiconductor layer 110 and the gate electrodes 115. An insulating film 121 can be arranged above the semiconductor layer 110 or the protection film 120. The insulating film 121 can be made of, for example, silicon oxide. The refractive index of the insulating film 121 falls within, for example, the range of 1.40 to 1.60. A first wiring layer 123, a second wiring layer 124, and a third wiring layer 133 can be arranged above the principal surface 111 of the semiconductor layer 110. The first wiring layer 123, the second wiring layer 124, and the third wiring layer 133 are arranged at different heights with reference to the principal surface 111 of the semiconductor layer 110. In one example, the conductive material of the first wiring layer 123 and the second wiring layer 124 can be copper, and the conductive material of the third wiring layer 133 can be aluminum. In one example, the third wiring layer 133 can form the wiring layer of the peripheral circuit region 103 and a pad. The conductive materials need only be materials having conductivity, and may be materials other than copper and aluminum. The first wiring layer 123 and the second wiring layer 124 can electrically be connected by a plug (not shown). The second wiring layer 124 and the third wiring layer 133 can electrically be connected by a plug (not shown). Except for portions electrically connected by the plug, the conductive member of the first wiring layer 123 and that of the second wiring layer 124 are insulated by the insulating film 121 and the conductive member of the second wiring layer 124 and that of the third wiring layer 133 are insulated by the insulating film 121. The insulating film 121 can function as an interlayer insulating film. The number of wiring layers is not limited to three.

The photoelectric conversion apparatus 100 can include a plurality of light guides 130 respectively arranged in the light paths of light beams entering the plurality of first photoelectric converters 112a in the light-receiving pixel region 101, and a coupling portion 131 spreading to connect the plurality of light guides 130. The plurality of light guides 130 and the coupling portion 131 can be made of the same material. In one example, the plurality of light guides 130 and the coupling portion 131 can be made of silicon nitride. The refractive indices of the members forming the plurality of light guides 130 are higher than that of the insulating film 121. The refractive indices of the members forming the plurality of light guides 130 preferably are equal to or higher than 1.60, and more preferably falls within the range of 1.80 to 2.40. The light guide 130 can be arranged above each of the plurality of second photoelectric converters 112a in the light-shielded pixel region 102. Similarly, the coupling portion 131 can spread to interconnect the plurality of light guides 130 in the light-shielded pixel region 102. The coupling portion 131 in the light-receiving pixel region 101 and that in the light-shielded pixel region 102 can spread to be interconnected. In the example shown in FIG. 2, the coupling portion 131 is not arranged in the peripheral circuit region 103. However, the coupling portion 131 may also be arranged in the peripheral circuit region 103.

An insulating film 132 can be arranged above the insulating film 121, the plurality of light guides 130, and the coupling portion 131 to spread over the light-receiving pixel region 101 and the light-shielded pixel region 102. From another viewpoint, the insulating film 132 is arranged above the principal surface 111 of the semiconductor layer 110 to spread over the light-receiving pixel region 101 and the light-shielded pixel region 102. The insulating film 132 can be made of, for example, silicon oxide. A light-shielding film 134 can be arranged above the insulating film 132 to cover the plurality of second photoelectric converters 112a in the light-shielded pixel region 102. The light-shielding film 134 can be made of, for example, a metal material. The light-shielding film 134 is arranged for the purpose of preventing light beams from entering the plurality of second photoelectric converters 112a in the light-shielded pixel region 102. The lower surface of the light-shielding film 134 is along the principal surface 111 of the semiconductor layer 110 to face the plurality of photoelectric converters 112b provided in the light-shielded pixel region 102. In one example, the third wiring layer 133 and the light-shielding film 134 can be arranged in the same layer and made of the same material. However, the third wiring layer 133 and the light-shielding film 134 may be arranged in different layers and made of different materials.

A light transmissive film (insulator) 140 can be arranged above the principal surface 111 of the semiconductor layer 110. The light transmissive film 140 can be arranged to cover the insulating film 132, the light-shielding film 134, and the third wiring layer 133. The light transmissive film 140 can include a plurality of intralayer lenses 141 respectively arranged in the light paths of light beams entering the plurality of first photoelectric converters 112a in the light-receiving pixel region 101. At least one of the upper and lower surfaces of the light transmissive film 140 having the intralayer lenses 141 can have a convex lens shape. In this example, the upper surface of the light transmissive film 140 has a convex lens shape, and the lower surface of the light transmissive film 140 is flat. However, if no intralayer lenses 141 are provided, the upper and lower surfaces of the light transmissive film 140 may be flat. The light transmissive film 140 can be arranged to cover the light-shielding film 134 in the light-shielded pixel region 102. If the intralayer lenses 141 are arranged in the light-shielded pixel region 102, the structure on the light-shielding film 134 becomes high, and thus the intralayer lenses 141 are preferably not arranged in the light-shielded pixel region 102. A planarization insulating film (insulating film 142) can be arranged above at least the intralayer lenses 141 in the light transmissive film 140 to cover the intralayer lenses 141. The insulating film 142 may contact the intralayer lenses 141, and antireflective coating provided to cover the intralayer lenses 141 while contacting the intralayer lenses 141 may be arranged between the intralayer lenses 141 and the insulating film 142.

The light transmissive film 140 is a silicon compound film made of a compound containing silicon and nitrogen. The light transmissive film 140 is a silicon compound film containing nitrogen, and can thus be discriminated from another light transmissive film such as a resin film or a silicon oxide film. The light transmissive film 140 can have a multilayer structure formed from a plurality of silicon compound layers each made of a compound containing silicon and nitrogen. The silicon compound layers that can be included in the light transmissive film 140 are, for example, a silicon nitride layer, a silicon oxynitride layer, and a silicon carbonitride layer.

Each intralayer lens 141 is formed by, for example, a silicon nitride layer, but may be formed by a silicon oxynitride layer having a nitrogen concentration higher than that of another silicon oxynitride layer included in the light transmissive film 140. A layer forming the intralayer lens 141 can be called an intralayer lens layer. If the above-described antireflective coating is formed by a compound containing silicon and nitrogen, such as a silicon oxynitride layer, the antireflective coating can be part of the light transmissive film 140. As the above-described antireflective coating, an antireflection film arranged above the light transmissive film 140 can be used.

An antireflection film or an insulating film on the light transmissive film 140 can be made of a compound containing silicon and oxygen. In one example, each intralayer lens 141 can be made of silicon nitride and the antireflective coating can be made of silicon oxide. In another example, each intralayer lens 141 can be made of silicon oxynitride and the antireflective coating can be made of silicon oxide. In still another example, each intralayer lens 141 can be made of silicon nitride and the antireflective coating can be made of silicon oxynitride. In one example, the insulating film 142 is made of silicon oxide. In another example, the insulating film 142 is made of a resin.

On the semiconductor layer 110 in the light-receiving pixel region 101, a light-shielding part 143 arranged to surround the light path of a light beam entering each of the plurality of first photoelectric converters 112a can be arranged. The light-shielding part 143 can be made of a metal material, for example, tungsten. The insulating film 142 can be arranged above the light transmissive film (insulator) 140, and the light-shielding part 143 can be arranged in a groove formed in the insulating film 142. A color filter layer 145 can be arranged above the insulating film 142, and microlenses 150 can be arranged above the color filter layer 145. The light-shielding part 143 can be arranged in a matrix (for example, a rectangular matrix) so as to prevent light from entering between pixels adjacent to each other in the row direction and the column direction.

In the photoelectric conversion apparatus 100, it is important to suppress the incidence of oblique light beams L', entering the microlens 150 in the light-receiving pixel region 101, on the second photoelectric converters 112b in the light-shielded pixel region 102. This is because if light beams enter the second photoelectric converters 112b in the light-shielded pixel region 102, it is impossible to correctly detect the optical black level. Therefore, the upper end of the light-shielding part 143 is preferably higher than the upper surface of the light-shielding film 134, and the lower end of the light-shielding part 143 is preferably lower than the upper surface of the light-shielding film 134. Alternatively, the upper end of the light-shielding part 143 is preferably higher than the upper surface of the light-shielding film 134, and the lower end of the light-shielding part 143 is preferably lower than the upper surface of the light-shielding film 134 and higher than the lower surface of the light-shielding film 134.

The light-shielding part 143 preferably has a structure that is continuous from the lower end of the light-shielding part 143 to its upper end. In other words, the light-shielding part 143 preferably has no portion made of a light transmissive material between the lower and upper ends of the light-shielding part 143. The light-shielding film 134 preferably has a structure that is continuous from the lower surface of the light-shielding film 134 to its upper surface. In other words, the light-shielding film 134 preferably has no portion made of a light transmissive material between the lower and upper surfaces of the light-shielding film 134. The thickness of the light-shielding part 143 is preferably larger than that of the light-shielding film 134. In the cross section (the sectional view of FIG. 2) that is orthogonal to the principal surface 111 of the semiconductor layer 110 and partially cuts the plurality of first photoelectric converters 112a, the width of the light-shielding part 143 in the direction parallel to the principal surface 111 is preferably 0.5 µm or less. This is advantageous in improving the pixel density.

The upper surface of the thinnest portion of the light transmissive film 140 in the light-receiving pixel region 101 is preferably lower than the upper surface of the light-shielding film 134. This is advantageous in suppressing the incidence of light beams on the second photoelectric converters 112b in the light-shielded pixel region 102. The uppermost end (vertex) of each of the plurality of intralayer lenses 141 in the light-receiving pixel region 101 is preferably lower than the upper surface of the light-shielding film 134. This is advantageous in suppressing the incidence of light beams on the second photoelectric converters 112b in the light-shielded pixel region 102 by lowering the height at which the microlenses 150 are arranged. As will be described later, the thinnest portion of the light transmissive film 140 in the light-receiving pixel region 101 may have a flat upper surface and the lower end of the light-shielding part 143 may be lower than the flat upper surface. This arrangement is also advantageous in suppressing the incidence of light beams on the second photoelectric converters 112b in the light-shielded pixel region 102.

A method of manufacturing the photoelectric conversion apparatus 100 according to the first embodiment will be described below with reference to FIGS. 3, 4, 5, and 6. In step S101, the semiconductor regions such as the photoelectric converters 112a and 112b, the semiconductor regions 113, and the FDs 114 are formed in the semiconductor layer 110 of the first conductivity type, and the gate electrodes 115, the protection film 120, an etching stop film 122, an insulating film 121a, and the like are formed on the principal surface 111. More specifically, in the step S101, the photoelectric converters 112a and 112b are formed in the semiconductor layer 110, and then a gate insulating film (not shown) and the gate electrodes 115 are formed on the principal surface 111 of the semiconductor layer 110. The semiconductor regions 113 and the FDs 114 are formed in the semiconductor layer 110. The protection film 120 is formed on the principal surface 111 of the semiconductor layer 110 to cover the gate electrodes 115. In one example, the protection film 120 can be made of silicon nitride. In another example, the protection film 120 can be formed by a plurality of insulating layers including a silicon nitride film and a silicon oxide film. The protection film 120 can have a function of reducing damage given to the photoelectric converters 112a and 112b in a subsequent step. The protection film 120 may have an antireflection function. Part of the insulating film 121a forming part of the insulating film 121 can be formed on the protection film 120, the etching stop film 122 can be formed thereon to cover the photoelectric converters 112a and 112b, and then another part of the insulating film 121a can be formed thereon. After that, the surface of the insulating film 121a can be planarized by a planarization process such as CMP. The etching stop film 122 can be formed by a silicon nitride film. The protection film 120 and the etching stop film 122 are arbitrary components and need not be formed.

In step S102, the first wiring layer 123, the second wiring layer 124, and the insulating film 121 are formed. For example, an insulating film 121b is formed on the insulating film 121a, and a region of the insulating film 121b, where a conductive member of the first wiring layer 123 is to be arranged, can be removed by etching. A metal film for forming the conductive member of the first wiring layer 123 is formed to cover the insulating film 121b over the light-receiving pixel region 101, the light-shielded pixel region 102, and the peripheral circuit region 103, and is removed by CMP or the like to expose the insulating film 121b. This forms the conductive member that forms a wiring pattern in the first wiring layer 123. Note that part of the conductive member of the first wiring layer 123 is electrically connected to a predetermined semiconductor region of the semiconductor layer 110 by a plug.

Insulating films 121c and 121d are formed on the insulating film 121b over the light-receiving pixel region 101, the light-shielded pixel region 102, and the peripheral circuit region 103. A region of the insulating film 121d, where a conductive member of the second wiring layer 124 is to be arranged, is removed by etching. Furthermore, a region of the insulator 124c, where a plug for electrically connecting the conductive member of the first wiring layer 123 and that of the second wiring layer 124 is to be arranged, is removed by etching. Next, a metal film serving as the material of the second wiring layer and the plug is formed over the light-receiving pixel region 101, the light-shielded pixel region 102, and the peripheral circuit region 103.

Next, the metal film is removed by CMP or the like until the insulating film 121d is exposed. In this procedure, the conductive member of the second wiring layer 124 and the plug are formed. After forming the insulating films 121c and 121d, a portion corresponding to the region where the plug for electrically connecting the conductive member of the first wiring layer 123 and that of the second wiring layer 124 may be removed by etching.

An insulating film 121e is formed over the light-receiving pixel region 101, the light-shielded pixel region 102, and the peripheral circuit region 103, and the surface of the insulating film 121e can be planarized by CMP or the like, as needed. The insulating film 121 is formed by the insulating films 121a, 121b, 121c, 121d, and 121e. In the insulating film 121, an etching stop film, a metal diffusion preventive film, or a film having the functions of the etching stop film and metal diffusion preventive film may be arranged, as needed. More specifically, if the insulating film 121 is made of silicon oxide, a silicon nitride film or a carbon containing silicon oxide film can be arranged as the etching stop film and the metal diffusion preventive film. The first wiring layer 123 and the second wiring layer 124 may be formed by a method other than the damascene method.

In step S103, a plurality of openings 125 for forming the light guides 130 are formed in the insulating film 121 in the light-receiving pixel region 101 and the light-shielded pixel region 102. The plurality of openings 125 can be formed by forming an etching mask by a photolithography process, and etching the insulating film 121 through the openings of the etching mask. If the etching stop film 122 is formed, the insulating film 121 can be etched until the etching stop film 122 is exposed. As for the etching stop film 122, an etching rate in the etching condition for etching the insulating film 121 is preferably lower than that of the insulating film 121. If the insulating film 121 is a silicon oxide film, the etching stop film 122 can be a silicon nitride film or a silicon oxynitride film. The insulating film 121 may be etched by a plurality of etching operations under different conditions until the etching stop film 122 is exposed.

In step S104, the plurality of light guides 130 and the coupling portion 131 are formed. More specifically, the plurality of openings 125 are filled with a material for forming the light guides 130 and the coupling portion 131 while the light guide forming material is deposited so that the upper surface of the insulating film 121 is covered with the material. This deposition can be performed by, for example, CVD, sputtering, or coating of an organic material represented by a polyimide-based polymer. Then, by planarization using an etch-back method or CMP method, the plurality of light guides 130 and the coupling portion 131 can be formed. The light guide forming material in the peripheral circuit region 103 can be removed. If, in step S103, the insulating film 121 is etched until the etching stop film 122 is exposed, the light guides 130 are formed to contact the etching stop film 122.

In the above example, although the light guide forming material on the insulating film 121 in the peripheral circuit region 103 is removed, it may not be removed. By depositing the same material a plurality of times, the plurality of light guides 130 and the coupling portion 131 may be formed. Alternatively, by sequentially deposing a plurality of different materials, the plurality of light guides 130 and the coupling portion 131 may be formed. For example, by depositing a silicon nitride film first, and then depositing an organic material having a high burying property, the plurality of light guides 130 and the coupling portion 131 may be formed.

The material of the light guides 130 and the coupling portion 131 is preferably a material having a refractive index higher than that of the insulating film 121. If the insulating film 121 is a silicon oxide film, the material of the plurality of light guides 130 and the coupling portion 131 is preferably silicon nitride. The silicon nitride film has a refractive index of about 2.0, and the surrounding silicon oxide film has a refractive index of about 1.4. For this reason, based on the Snell's law, light entering the interface between each light guide 130 and the insulating film 121 is reflected. This can confine light in each light guide 130.

In step S105, the insulating film 132 is formed to cover the coupling portion 131 and the insulating film 121, in other words, over the light-receiving pixel region 101, the light-shielded pixel region 102, and the peripheral circuit region 103. The upper surface of the insulating film 132 can be planarized by a planarization process such as CMP, as needed. The planarization of the surface of the insulating film 132 is advantageous in improving the processing accuracy of the third wiring layer 133 and the light-shielding film 134, both of which are to be formed later.

In step S106, the third wiring layer 133 and the light-shielding film 134 are formed. More specifically, in step S106, the third wiring layer 133 and the light-shielding film 134 can be formed by forming a metal film on the insulating film 132, forming an etching mask on the metal film by a photolithography process, and etching the metal film through the openings of the etching mask. The third wiring layer 133 and the light-shielding film 134 can be made of, for example, aluminum. Note that the third wiring layer 133 can electrically be connected to the second wiring layer 124 by a plug (not shown).

In step S107, the light transmissive film 140 including the plurality of intralayer lenses 141 is formed. First, a material film for forming the light transmissive film 140 is formed to cover the insulating film 132, the light-shielding film 134, and the third wiring layer 133. The material film (that is, the light transmissive film 140) can be made of silicon oxide or silicon oxynitride. In other words, the material film (that is, the light transmissive film 140) can be made of a compound containing silicon and nitrogen. An antireflection film formed by a silicon oxide film, a silicon oxynitride film, or the like can be arranged above the intralayer lens 141. The antireflection film can be made of a compound containing silicon and oxygen. Next, an etching mask pattern is formed on the material film, and can be processed, as needed. For example, a curved surface to be transferred to the underlying material film can be formed by heating the etching mask pattern. The curved surface can be transferred to the material film by partially etching the material film via the etching mask, thereby forming the plurality of intralayer lenses 141. The upper surface of each intralayer lens 141 has a convex shape upward, and each intralayer lens 141 is formed to be aligned at the position of the corresponding light guide 130. The uppermost ends of the plurality of intralayer lenses 141 in the light-receiving pixel region 101 are preferably lower than the upper end of the light-shielding film 134.

In step S108, the insulating film 142 and the light-shielding part 143 are formed on the light transmissive film 140 or the antireflection film. First, the insulating film 142 can be formed on the light transmissive film 140 or the antireflection film, and the upper surface of the insulating film 142 can be planarized by a planarization process such as CMP. The insulating film 142 can be made of, for example, silicon oxide. An etching mask is formed on the insulating film 142 by a photolithography process, and the insulating film 142 is etched through the opening of the etching mask, thereby forming a groove in a region of the insulating film 142, where the light-shielding part 143 is to be formed. The groove formed in the insulating film 142 is filled with a light-shielding material or a metal material, and the light-shielding material is removed by a planarization process such as CMP so that the upper surface of the insulating film 142 is exposed. This forms the light-shielding part 143. The light-shielding part 143 can be made of, for example, tungsten.

In the cross section (the sectional view of FIG. 5) that is orthogonal to the principal surface 111 of the semiconductor layer 110 and partially cuts the plurality of first photoelectric converters 112a, the width of the light-shielding part 143 in the direction parallel to the principal surface 111 is preferably 0.5 µm or less. This is advantageous in improving the pixel density. If the light-shielding film 134 arranged to cover the plurality of photoelectric converters 112b in the light-shielded pixel region 102 is thickened, it becomes difficult to planarize the insulating film 142 on the light-shielding film 134. On the other hand, since the light-shielding part 143 is formed by forming a groove in the insulating film 142 and filling the groove with a metal material, it is easy to form the thick light-shielding part 143. By making the light-shielding part 143 thicker than the light-shielding film 134, it is possible to suppress the incidence of light beams, entering the light-receiving pixel region 101 from an oblique direction, on the photoelectric converters 112b in the light-shielded pixel region 102.

In step S109, the color filter layer 145 is formed on the insulating film 142, and then the microlenses 150 are formed on the color filter layer 145.

Figure 7:
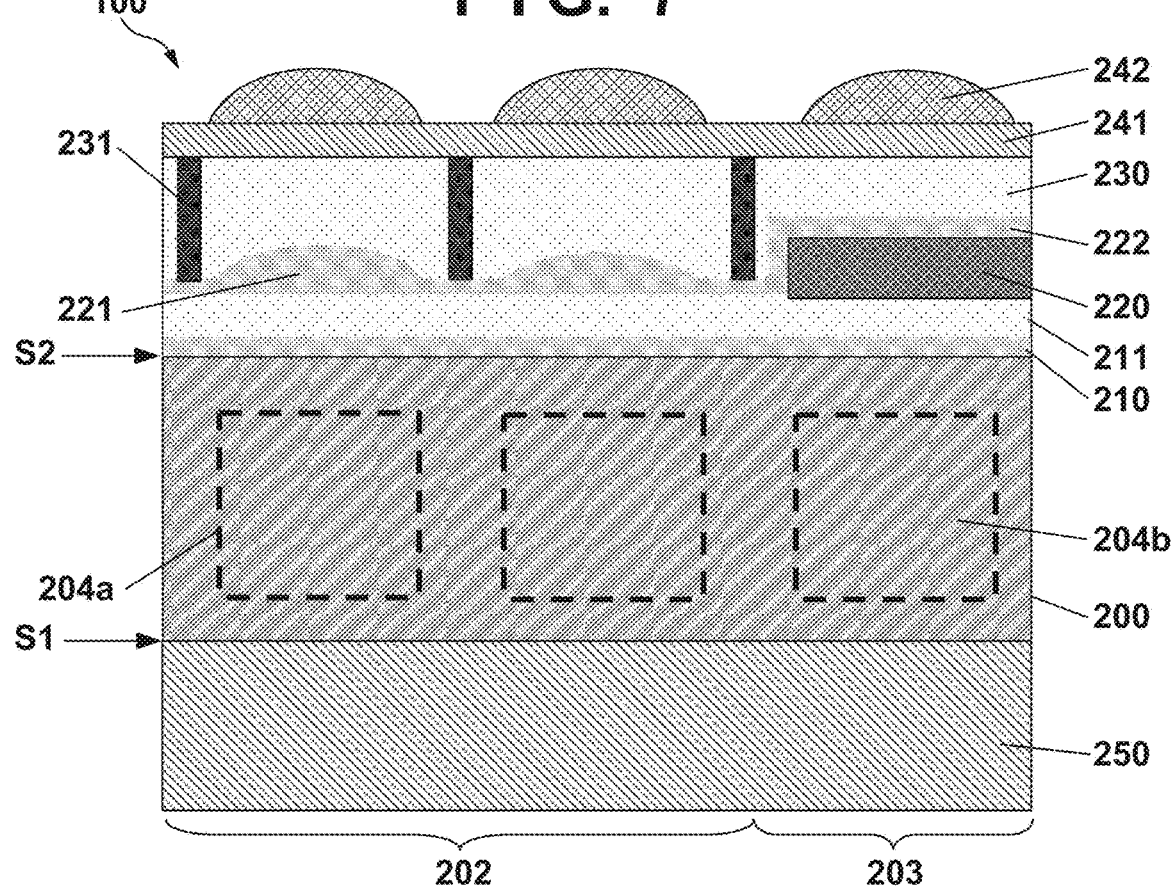
FIG. 7 is a sectional view showing the arrangement of a photoelectric conversion apparatus according to the second embodiment of the present invention.

A photoelectric conversion apparatus 100 according to the second embodiment of the present invention will be described below with reference to FIG. 7. Items which are not referred to as the second embodiment can comply with the first embodiment. The photoelectric conversion apparatus 100 according to the second embodiment is formed as a back-side illumination CMOS sensor. Light beams enter a plurality of photoelectric converters 204a through structures (for example, microlenses 242) arranged above a principal surface 201 of a semiconductor layer 200.

The photoelectric conversion apparatus 100 includes a light-receiving pixel region 202 and a light-shielded pixel region 203. A wiring structure 250 including gate electrodes and a wiring layer is arranged under a first surface S1 out of the two surfaces of the semiconductor layer 200, that is, the first surface S1 and a second surface S2. An antireflection film 210 can be arranged above the second surface S2 of the semiconductor layer 200. The antireflection film 210 can be made of, for example, aluminum oxide, hafnium oxide, or tantalum oxide. An insulating film 211 can be provided on the antireflection film 210. The insulating film 211 can be made of, for example, silicon oxide. Note that in this specification, "on" and "under" are relative expressions and thus "on" and "under" can be swapped.

A plurality of second photoelectric converters 204b are arranged in the light-shielded pixel region 203. A light-shielding film 220 can be arranged in the light-shielded pixel region 203. The light-shielding film 220 can be made of, for example, a metal material such as aluminum or tungsten. As the distance between the light-shielding film 220 and the second surface S2 of the semiconductor layer 200 is smaller, it is possible to suppress the incidence of light beams on the photoelectric converters 204b in the light-shielded pixel region 203, and it is thus desirable that the distance between the light-shielding film 220 and the second surface S2 of the semiconductor layer 200 is smaller.

A light transmissive film (insulator) 222 can be arranged above the insulating film 211. The light transmissive film 222 can be arranged to cover the insulating film 211 and the light-shielding film 220. The light transmissive film 222 can include a plurality of intralayer lenses 221 arranged in the light paths of light beams entering the plurality of first photoelectric converters 204a in the light-receiving pixel region 202. The light transmissive film 222 can be arranged to cover the light-shielding film 220 in the light-shielded pixel region 203.

An antireflection film or an insulating film can be arranged above at least the intralayer lenses 221 in the light transmissive film 222 so as to cover the intralayer lenses 221 while contacting the intralayer lenses 221. The light transmissive film 222 can be made of a compound containing silicon and nitrogen, and the antireflection film or the insulating film can be made of a compound containing silicon and oxygen. In one example, the light transmissive film 222 can be made of silicon nitride and the antireflection film or the insulating film can be made of silicon oxide. In another example, the light transmissive film 222 can be made of silicon oxynitride and the antireflection film or the insulating film can be made of silicon oxide.

A light-shielding part 231 arranged to surround the light path of a light beam entering each of the plurality of first photoelectric converters 204a can be arranged above the semiconductor layer 200 in the light-receiving pixel region 202. The light-shielding part 231 can be made of a metal material, for example, tungsten. An insulating film 230 can be arranged above the light transmissive film (insulator) 221, and the light-shielding part 231 can be arranged in a groove formed in the insulating film 230. A color filter layer 241 can be arranged above the insulating film 230, and the microlenses 242 can be arranged above the color filter layer 241. The light-shielding part 231 can be arranged in a matrix (for example, a rectangular matrix) so as to prevent light from entering between pixels adjacent to each other in the row direction and the column direction.

The upper end of the light-shielding part 231 is preferably higher than the upper surface of the light-shielding film 220, and the lower end of the light-shielding part 231 is preferably lower than the upper surface of the light-shielding film 220. Alternatively, the upper end of the light-shielding part 231 is preferably higher than the upper surface of the light-shielding film 220, and the lower end of the light-shielding part 231 is preferably lower than the upper surface of the light-shielding film 220 and higher than the lower surface of the light-shielding film 220.

The light-shielding part 231 preferably has a structure that is continuous from the lower end of the light-shielding part 231 to its upper end. In other words, the light-shielding part 231 preferably has no portion made of a light transmissive material between the lower and upper ends of the light-shielding part 231. The light-shielding film 220 preferably has a structure that is continuous from the lower surface of the light-shielding film 220 to its upper surface. In other words, the light-shielding film 220 preferably has no portion made of a light transmissive material between the lower and upper surfaces of the light-shielding film 220. The thickness of the light-shielding part 231 is preferably larger than that of the light-shielding film 220. In the cross section (the sectional view of FIG. 7) that is orthogonal to the second surface S2 of the semiconductor layer 200 and partially cuts the plurality of first photoelectric converters 204a, the width of the light-shielding part 231 in the direction parallel to the principal surface 201 is preferably 0.5 µm or less. This is advantageous in improving the pixel density.

The upper surface of the thinnest portion of the light transmissive film 222 in the light-receiving pixel region 202 is preferably lower than the upper surface of the light-shielding film 220. This is advantageous in suppressing the incidence of light beams on the second photoelectric converters 204b in the light-shielded pixel region 203. The uppermost end of each of the plurality of intralayer lenses 221 in the light-receiving pixel region 202 is preferably lower than the upper surface of the light-shielding film 220. This is advantageous in suppressing the incidence of light beams on the second photoelectric converters 204b in the light-shielded pixel region 203 by lowering the height at which the microlenses 242 are arranged. As will be described later, the thinnest portion of the light transmissive film 222 in the light-receiving pixel region 202 may have a flat upper surface and the lower end of the light-shielding part 231 may be lower than the flat upper surface. This arrangement is also advantageous in suppressing the incidence of the light beams on the second photoelectric converters 204b in the light-shielded pixel region 203.

Figure 8A:
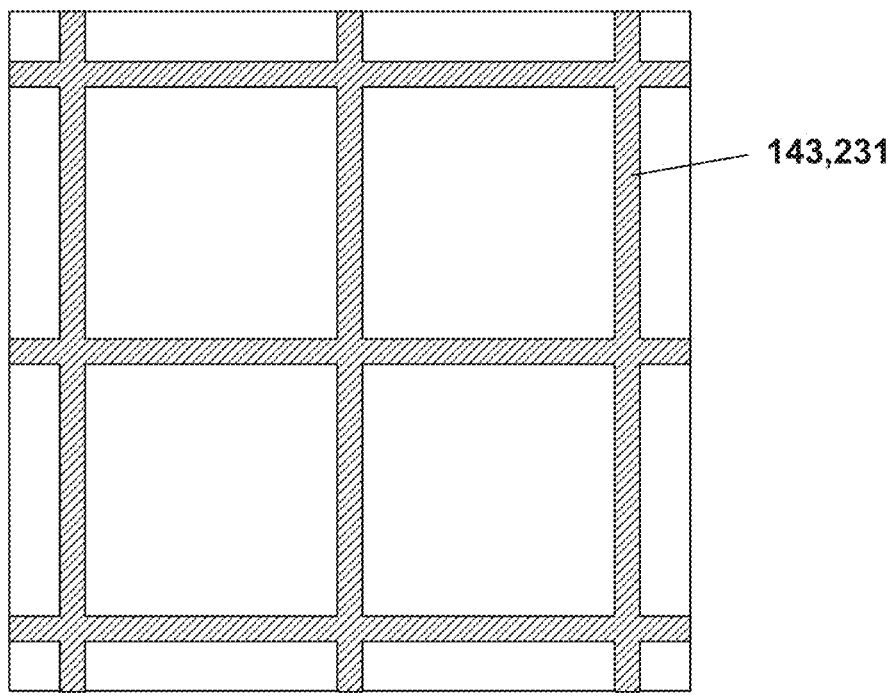
FIGS. 8A and 8B are views each showing an example of the arrangement of a light-shielding part.

FIG. 8A is a plan view showing an example of the arrangement of the light-shielding part 143 or 231 of the photoelectric conversion apparatus 100 according to the first or second embodiment. This plan view shows a structure in a plane parallel to the principal surface 111 of the semiconductor layer 110 or the second surface S2 of the semiconductor layer 200. As exemplified in FIG. 8A, the light-shielding part 143 or 231 of the photoelectric conversion apparatus 100 according to the first or second embodiment can be arranged in a matrix (for example, a rectangular matrix).

Figure 8B:
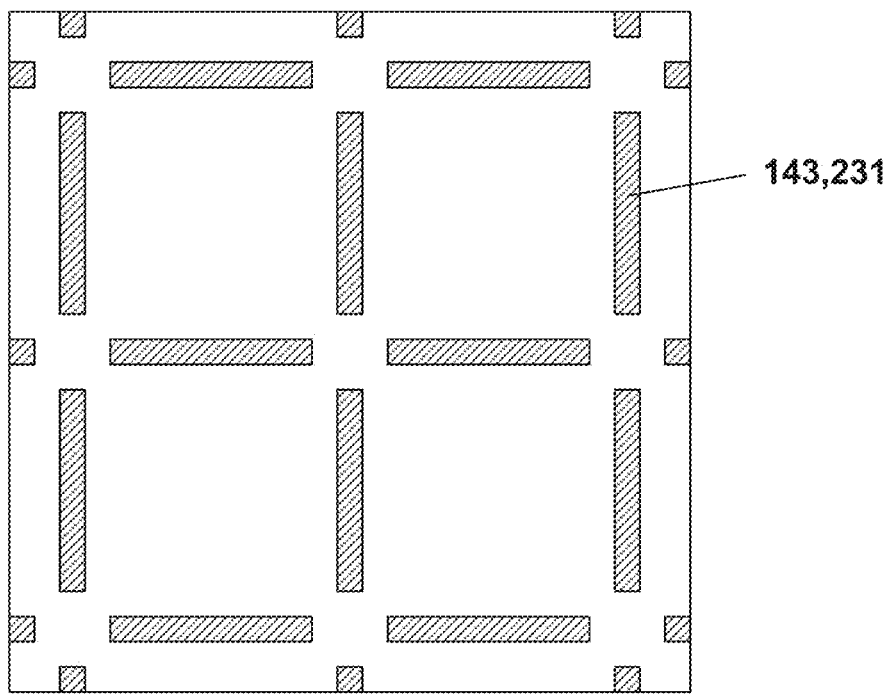

FIG. 8B is a plan view showing another example of the arrangement of the light-shielding part 143 or 231 of the photoelectric conversion apparatus 100 according to the first or second embodiment. This plan view shows a structure in a plane parallel to the principal surface 111 of the semiconductor layer 110 or the second surface S2 of the semiconductor layer 200. As exemplified in FIG. 8B, the light-shielding part 143 or 231 of the photoelectric conversion apparatus 100 according to the first or second embodiment can have a plurality of portions electrically insulated from each other. In addition, as exemplified in FIG. 8B, each of the light paths of light beams entering the plurality of first photoelectric converters can be surrounded by four of the plurality of portions.

Figure 9:
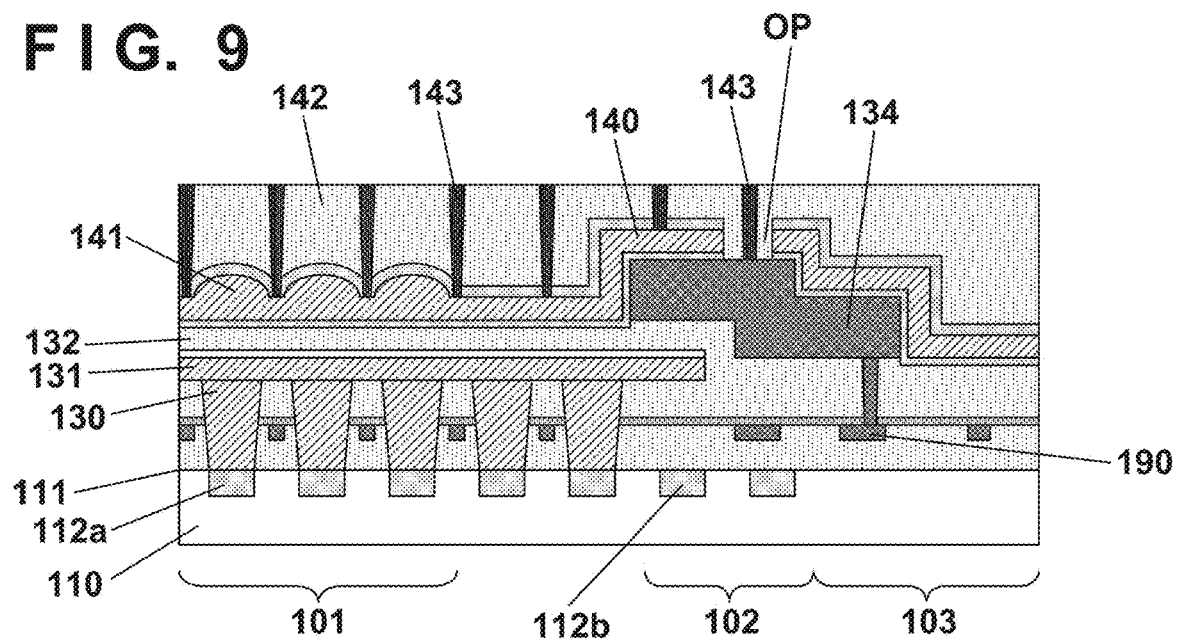
FIG. 9 is a view exemplifying an arrangement that applies a fixed potential to the light-shielding part and a light-shielding film.

FIG. 9 exemplifies an arrangement that applies a fixed potential to the light-shielding part 143 or 231 and the light-shielding film 134 or 220 of the photoelectric conversion apparatus 100 according to the first or second embodiment. Note that for the sake of descriptive convenience, FIG. 9 shows only reference numerals according to the first embodiment. Although a description will be provided below using the reference numerals according to the first embodiment, the description can also be applied to the second embodiment.

For example, the light-shielding part 143 can electrically be connected to the light-shielding film 134 through an opening OP formed in the light transmissive film 140 in the light-shielded pixel region 102. The light-shielding film 134 can electrically be connected to, for example, a conductive pattern 190, and a fixed potential (for example, a power supply potential or a ground potential) can be applied via the conductive pattern 190. This can provide the fixed potential to the light-shielding part 143 and the light-shielding film 134. In one example, the light-shielding film 134 is arranged in the fourth wiring layer, and can electrically be connected to, via a plug, the conductive pattern 190 arranged in the third wiring layer. However, the light-shielding film 134 and the conductive pattern may be arranged in other wiring layers. If the potentials of the light-shielding part 143 and the light-shielding film 134 are unfixed, signals read out from the photoelectric converters 112a and 112b can vary due to the influence of the unfixed potentials. Therefore, the potentials of the light-shielding part 143 or 231 and the light-shielding film 134 are preferably fixed. Application of the fixed potential to the light-shielding part 143 and the light-shielding film 134 is advantageous since this can lower the resistance of the voltage to reduce noise such as magnetic noise.

Figure 10:
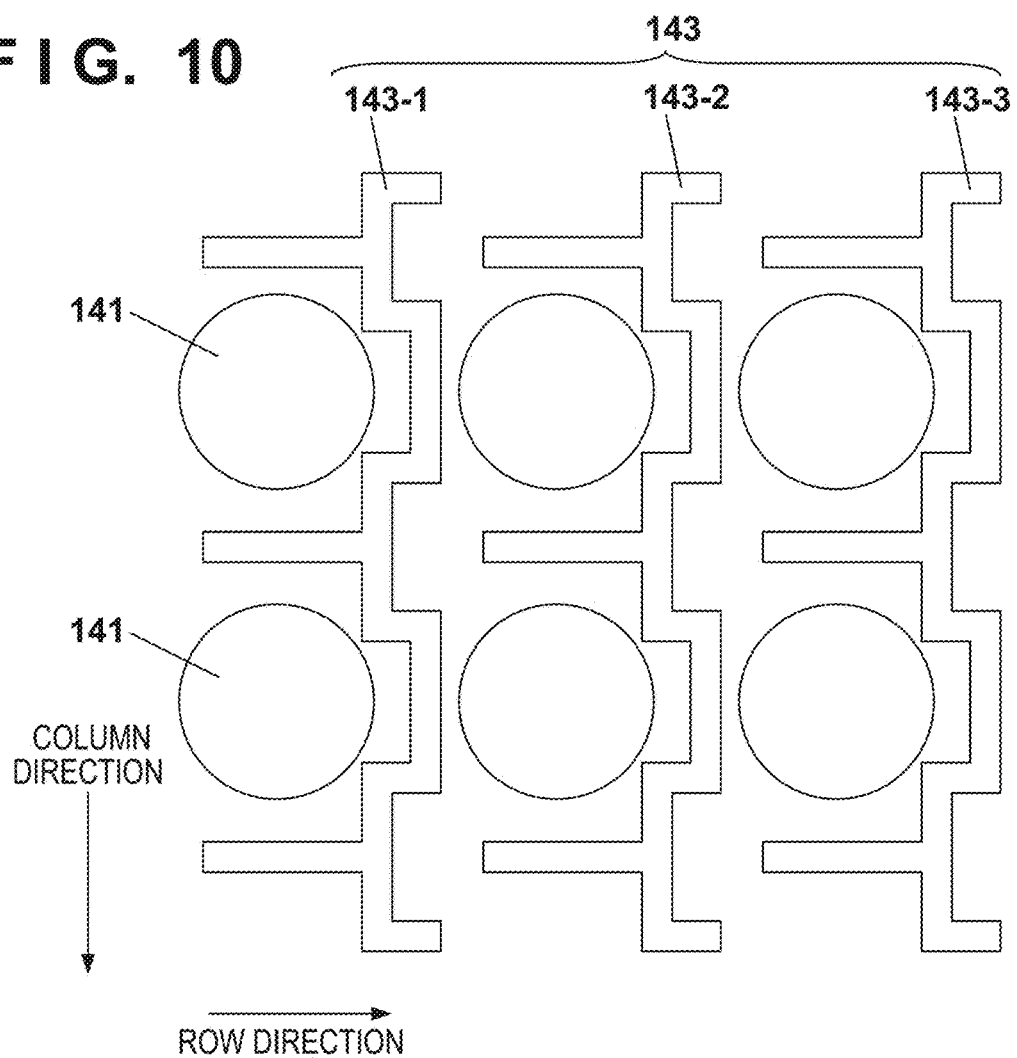
FIG. 10 is a view showing an example of the arrangement of the light-shielding part.

FIG. 10 exemplifies the arrangement of the light-shielding part 143 or 231 of the photoelectric conversion apparatus 100 according to the first or second embodiment. Note that for the sake of descriptive convenience, FIG. 10 shows only reference numerals according to the first embodiment. Although a description will be provided below using the reference numerals according to the first embodiment, the description can also be applied to the second embodiment.

As exemplified in FIG. 10, the light-shielding part 143 of the photoelectric conversion apparatus 100 according to the first or second embodiment can include a plurality of portions 143-1, 143-2, 143-3, . . . electrically insulated from each other. Each of the plurality of portions 143-1, 143-2, 143-3, . . . corresponds to one column and is continuous without being divided. In FIG. 10, the column direction indicates a direction in which a column signal line to which the signals of the photoelectric converters of each column are output extends, and the row direction indicates a direction (a direction in which a signal line driven by a row selection circuit extends) orthogonal to the column direction.

This arrangement is advantageous in reducing a horizontal smear. To explain this, consider a case in which a matrix structure in which the plurality of portions 143-1, 143-2, 143-3, . . . are electrically interconnected is provided and a potential is unfixed. In this case, if the potential of an FD of a given row and a given column largely varies, the potential of the light-shielding part varies due to the influence of the variation of the potential, thereby causing the potential of an FD of the same row and another column to vary. This may generate a horizontal smear. As described above, if the light-shielding part 143 is divided into the plurality of portions 143-1, 143-2, 143-3, . . . respectively corresponding to the columns, the influence among the FDs (pixels) of the same row via the light-shielding part can be reduced.

Figure 11:
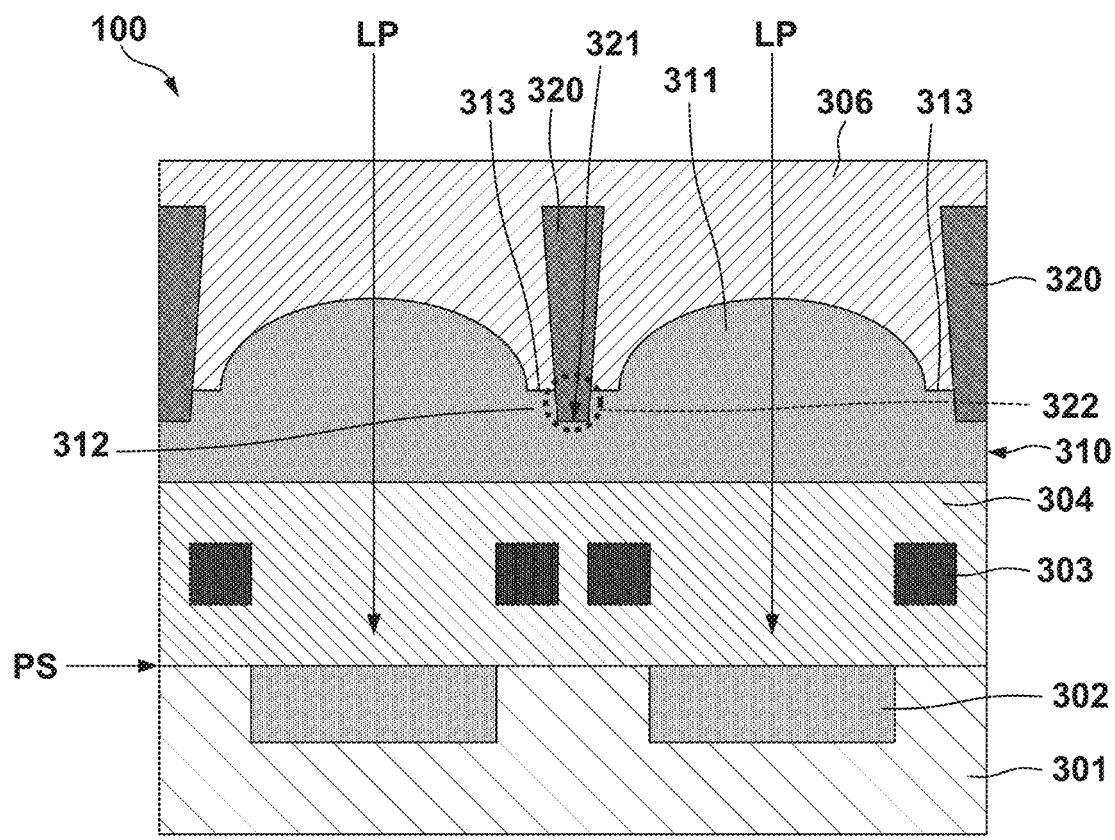
FIG. 11 is a sectional view showing the arrangement of a photoelectric conversion apparatus according to the third embodiment of the present invention.

A photoelectric conversion apparatus 100 according to the third embodiment of the present invention will be described below with reference to FIG. 11. Items which are not referred to as the third embodiment can comply with the first or second embodiment. The positional relationship between a light-shielding part to be described in the third embodiment and an antireflection film or insulating film arranged under the light-shielding part can be provided to the first or second embodiment.

The photoelectric conversion apparatus 100 can include a semiconductor layer 301 including a plurality of photoelectric converters 302 arranged in a light-receiving pixel region, and a wiring layer 303 and an insulating film 304 arranged above a principal surface PS of the semiconductor layer 301. The wiring layer 303 is arranged in the insulating film 304. The photoelectric conversion apparatus 100 can also include an insulating film 310 arranged above the insulating film 304, an insulating film 306 arranged above the insulating film 310, and a light-shielding part 320 arranged to surround light paths LP of light beams entering the photoelectric converters 302. The insulating film 310 may be a light transmissive film including intralayer lenses 311 arranged in the light paths LP. Alternatively, the insulating film 310 may be flat as a whole or include a three-dimensional structure caused by a base pattern. The insulating film 310 is compatible with the light transmissive film 140 or 222 according to the first or second embodiment.

The insulating film 310 can include a flat portion 312 having a flat upper surface 313. The lower end 321 of the light-shielding part 320 is lower than the flat upper surface 313, and the side surface of the lower portion 322 of the light-shielding part 320 can be surrounded by the flat portion 312. If the insulating film 310 includes the plurality of intralayer lenses 311, the flat portion 312 can be arranged among the plurality of intralayer lenses 311. In one example, the width of the lower end of the light-shielding part 320 is smaller than that of the upper end of the light-shielding part 320. This structure can be implemented by forming a groove in the insulating film 306 by etching, and filling the groove with a light-shielding material to form the light-shielding part 320.

A photoelectric conversion apparatus 100 according to the fourth embodiment of the present invention will be described below with reference to FIGS. 12, 13, 14, 15, 16, and 17. Items which are not referred to as the fourth embodiment can comply with one of the first to third embodiments or a combination thereof. The positional relationship between a light-shielding part to be described in the fourth embodiment and an antireflection film or insulating film arranged under the light-shielding part can be applied to the first or second embodiment.

Figure 12:
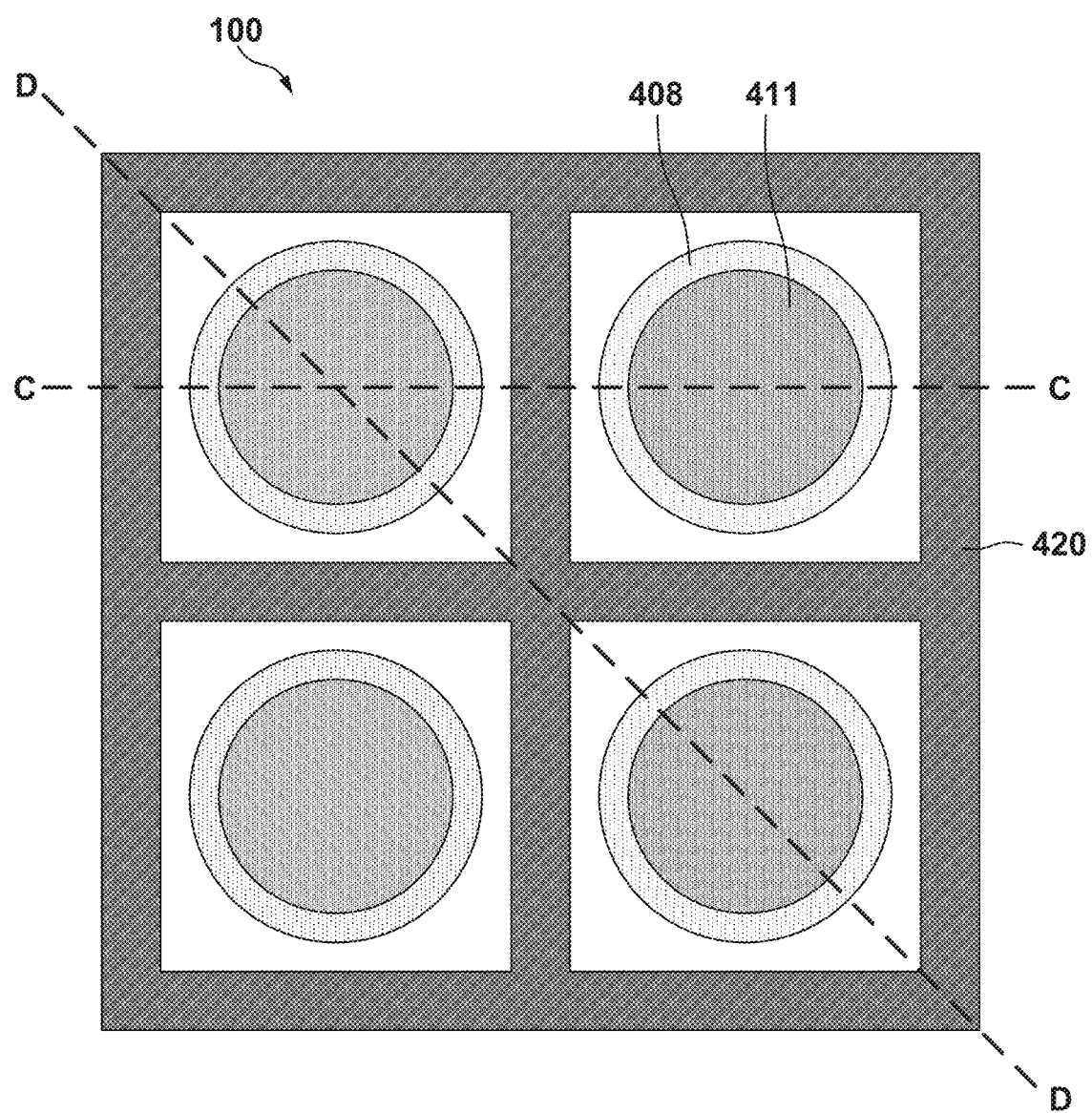
FIG. 12 is a plan view showing the arrangement of a photoelectric conversion apparatus according to the fourth embodiment of the present invention.
Figure 13:
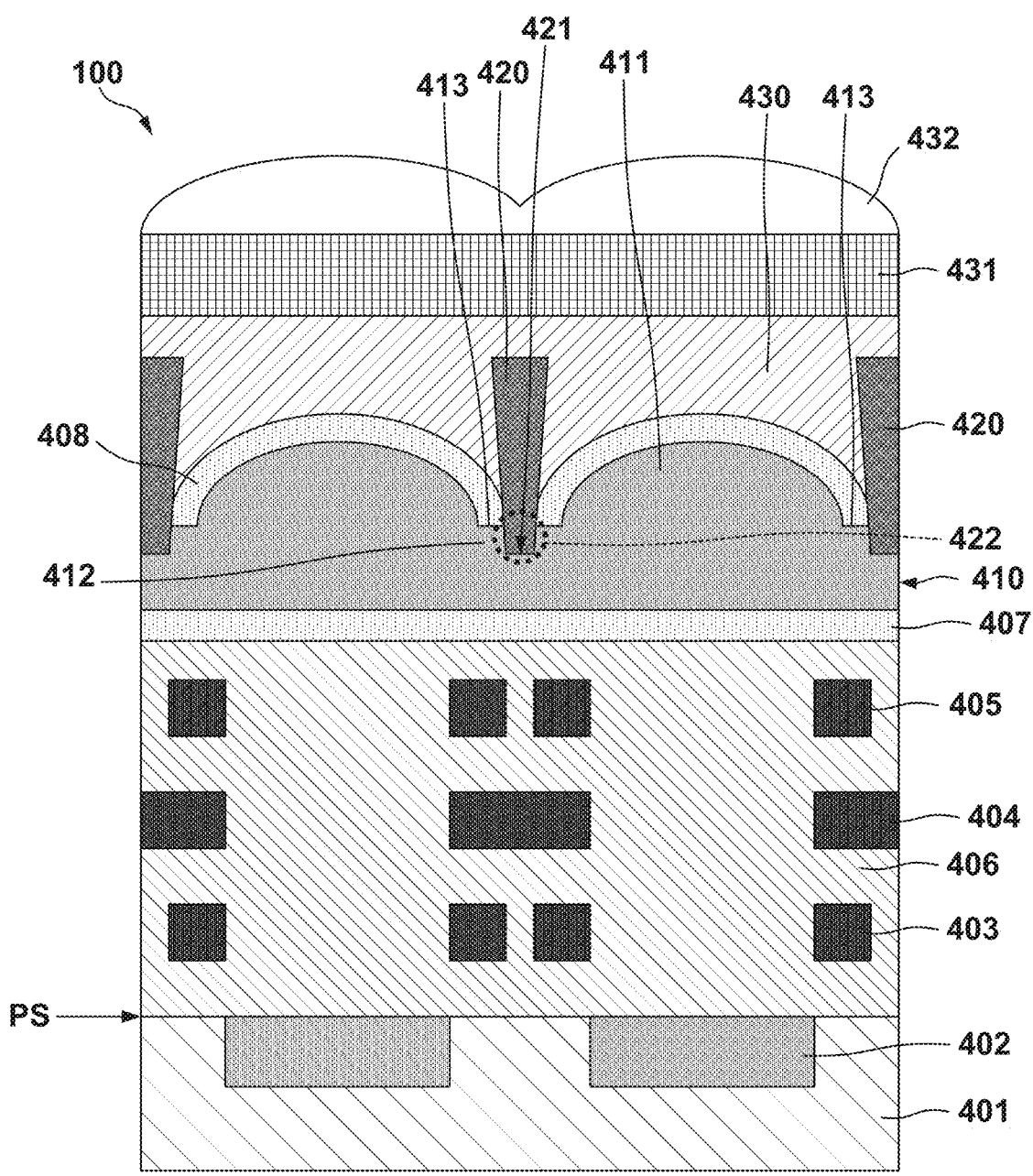
FIG. 13 is a sectional view showing the arrangement of the photoelectric conversion apparatus according to the fourth embodiment of the present invention.
Figure 14:
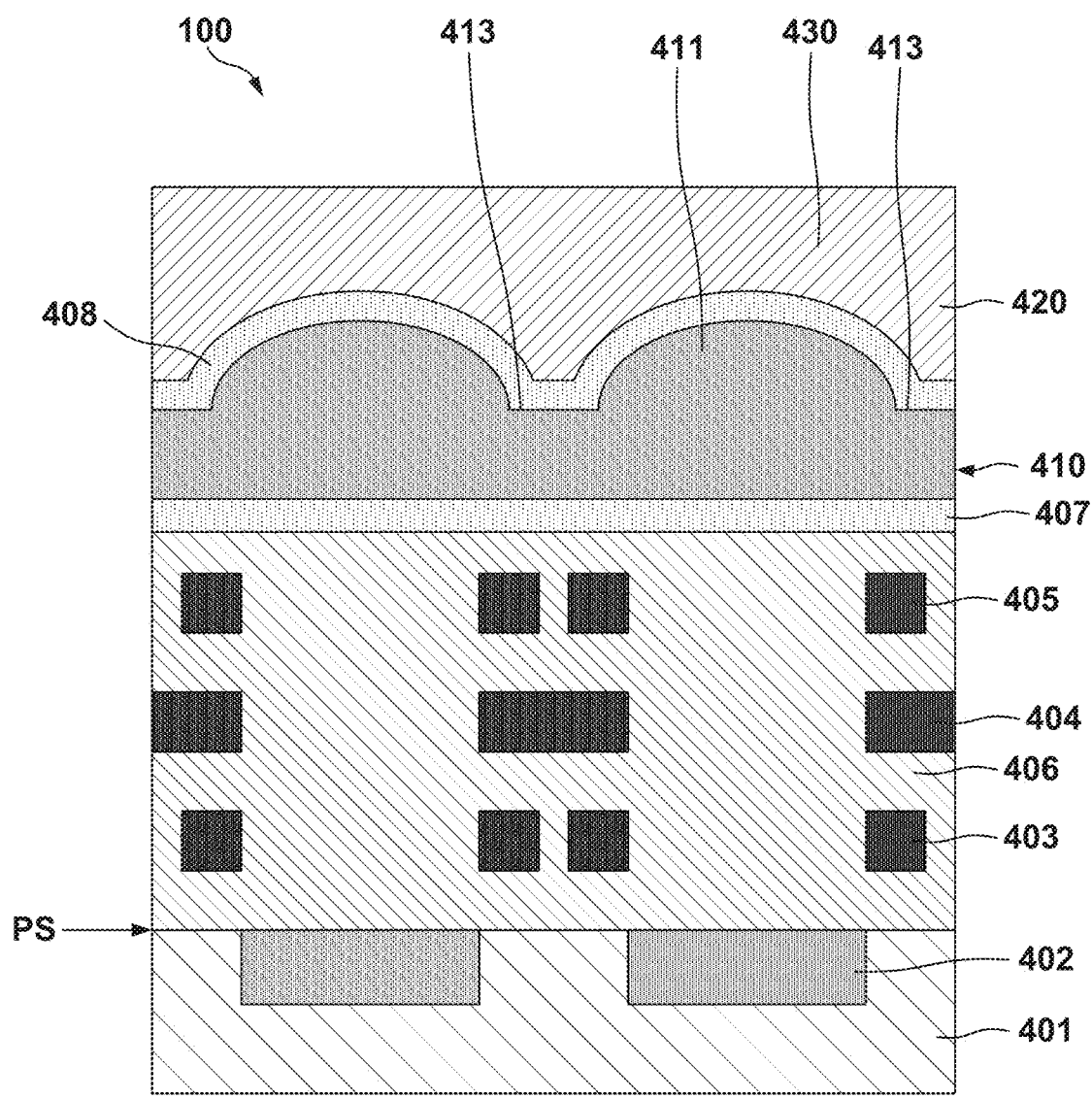
FIG. 14 is a sectional view showing a method of manufacturing the photoelectric conversion apparatus according to the fourth embodiment of the present invention.
Figure 15:
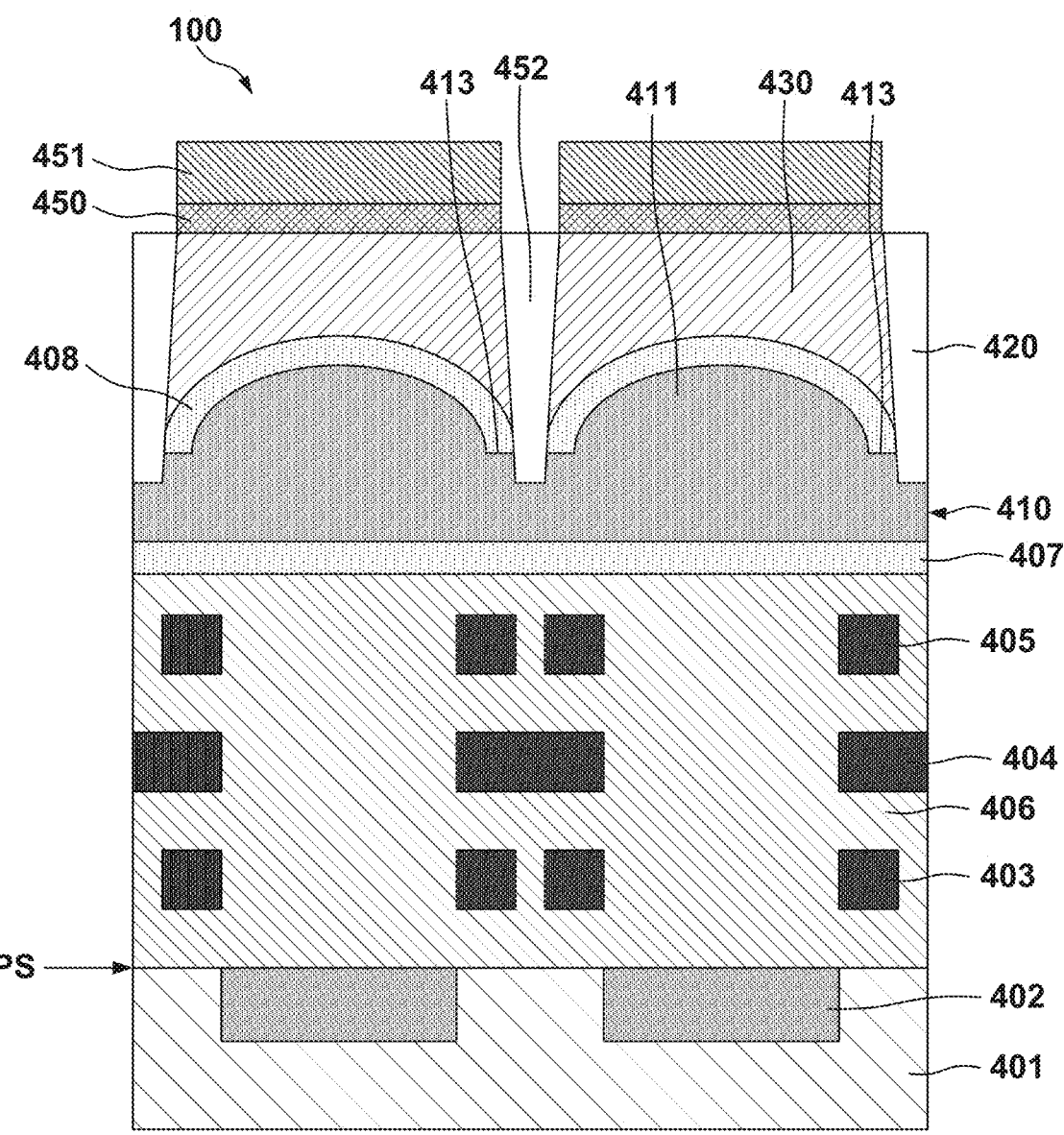
FIG. 15 is a sectional view showing the method of manufacturing the photoelectric conversion apparatus according to the fourth embodiment of the present invention.
Figure 16:
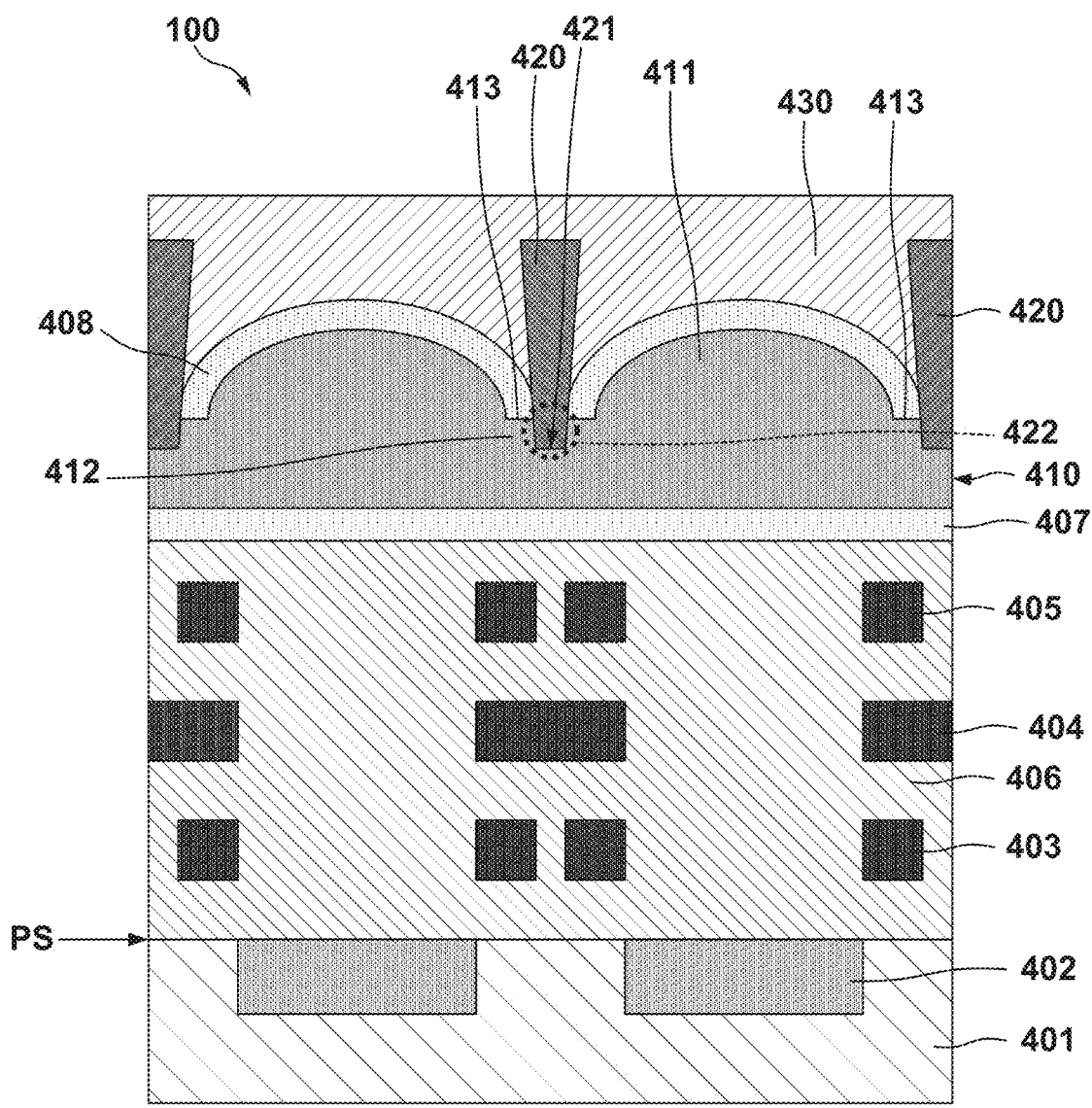
FIG. 16 is a sectional view showing the method of manufacturing the photoelectric conversion apparatus according to the fourth embodiment of the present invention.

FIG. 12 is a plan view showing the arrangement of part of the photoelectric conversion apparatus 100 according to the fourth embodiment, and shows a portion corresponding to a portion (four pixels) arranged in a light-receiving pixel region 101 shown in FIG. 1. FIG. 13 is a sectional view taken along a line C-C in FIG. 12 and showing the photoelectric conversion apparatus 100. The photoelectric conversion apparatus 100 includes the light-receiving pixel region with a plurality of light-receiving pixels. Although not shown in FIG. 13, the photoelectric conversion apparatus 100 according to the fourth embodiment can include a light-shielded pixel region and a peripheral circuit region, both of which are similar to those of the photoelectric conversion apparatus 100 according to each of the first to third embodiments. Each of the light-receiving pixels arranged in the light-receiving pixel region includes a photoelectric converter which light enters, and each of light-shielding pixels arranged in the light-shielded pixel region includes a shielded photoelectric converter.

The photoelectric conversion apparatus 100 can include a semiconductor layer 401 including a plurality of photoelectric converters 402 arranged in the light-receiving pixel region, and wiring layers 403, 404, and 405 and an insulating film 406, all of which are arranged above a principal surface PS of the semiconductor layer 401. The wiring layers 403, 404, and 405 are arranged in the insulating film 406. The photoelectric conversion apparatus 100 can further include an antireflection film 407 having a refractive index higher than that of the insulating film 406, and a light transmissive film 410 arranged to contact the upper surface of the antireflection film 407 and having a refractive index higher than that of the antireflection film 407. The photoelectric conversion apparatus 100 can also include an antireflection film 409 arranged to contact the upper surface of the light transmissive film 410 and having a refractive index lower than that of the light transmissive film 410. A stacked film formed by the antireflection film 407, the light transmissive film 410, and the antireflection film 409 can function as a passivation film. Instead of providing the light transmissive film 410, a flat film or a film having a three-dimensional structure caused by a base pattern may be provided. The light transmissive film 410 is compatible with each of the light transmissive films 140 and 222 and the insulating film 310 according to the first, second, and third embodiments.

A light-shielding part 420 arranged to surround the light paths of light beams entering the plurality of photoelectric converters 402 can be arranged above the semiconductor layer 401. The light-shielding part 420 can be made of a metal material, for example, tungsten. An insulating film 430 can be arranged above the light transmissive film (insulator) 410. The upper surface of the insulating film 430 can be planarized. The light-shielding part 420 can be arranged in a groove formed in the insulating film 430. A color filter layer 431 can be arranged above the insulating film 430 and microlenses 432 can be arranged above the color filter layer 431. The light-shielding part 420 can be arranged in a matrix (for example, a rectangular matrix) so as to prevent light from entering between pixels adjacent to each other in the row direction and the column direction. The light-shielding part 420 is compatible with each of the light-shielding parts 143 and 320 according to the first and second embodiments.

The light transmissive film (insulator) 410 can include a flat portion 412 having a flat upper surface 413. A lower end 421 of the light-shielding part 420 is lower than the flat upper surface 413, and the side surface of a lower portion 422 of the light-shielding part 420 can be surrounded by the flat portion 412. The flat portion 412 can be arranged among a plurality of intralayer lenses 411. In one example, the width of the lower end of the light-shielding part 420 is smaller than that of the upper end of the light-shielding part 420. This structure can be implemented by forming a groove in the insulating film 430 by etching, and filling the groove with a light-shielding material to form the light-shielding part 420. The light-shielding part 420 can be arranged to penetrate an antireflection film (insulating film) 408 that covers the light transmissive film (insulator) 410 while contacting the light transmissive film 410.

By making the lower end 421 of the light-shielding part 420 lower than the flat upper surface 413, it is possible to reduce leakage of light entering a pixel to the outside of the pixel. This can reduce the incidence of light beams, entering the light-receiving pixel region, on the photoelectric converters in the light-shielded pixel region, and also reduce entrance of light from a pixel to another pixel.

Figure 27:
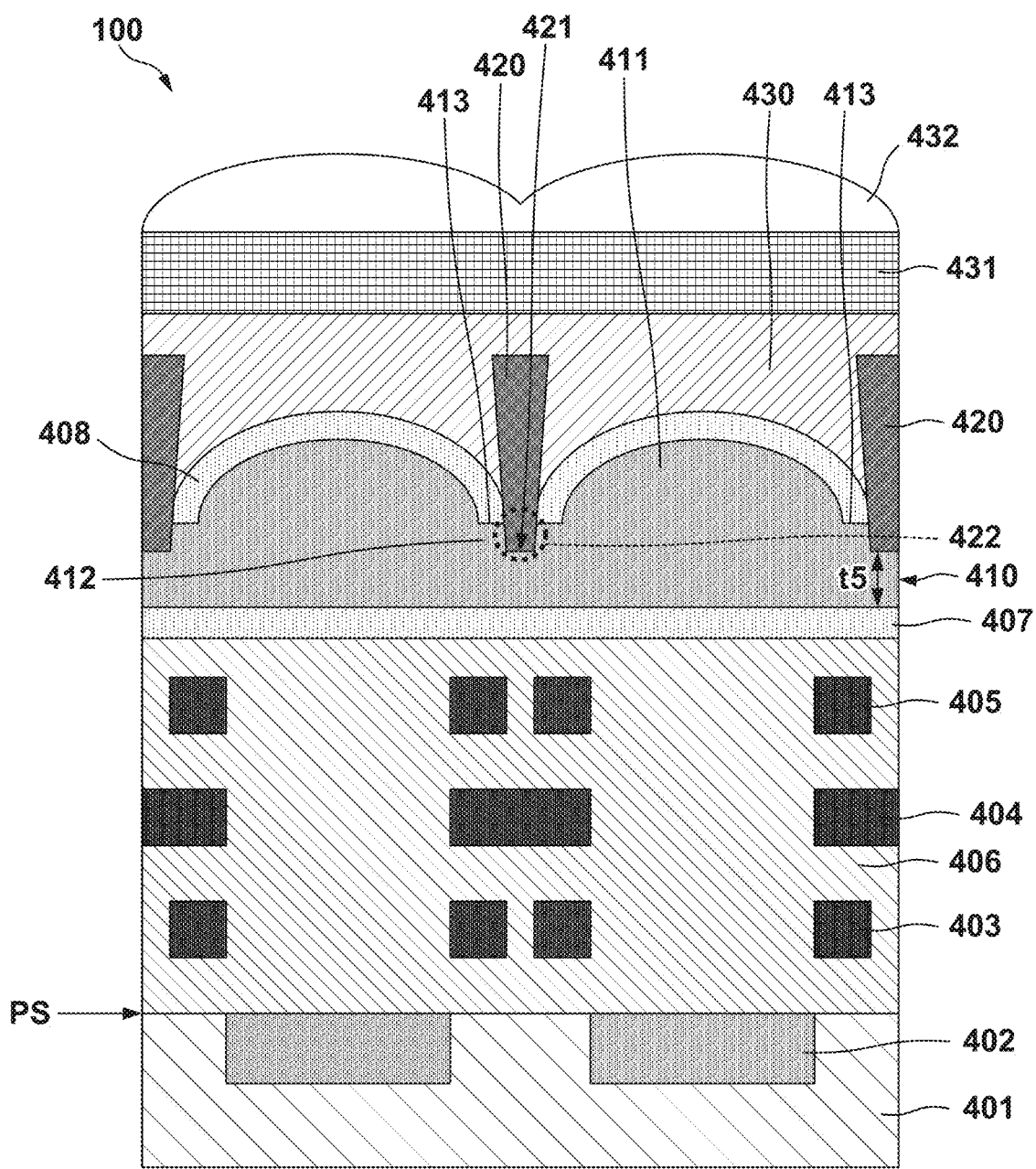
FIG. 27 is a sectional view for complementing a description made with reference to FIG. 13.

To provide the light transmissive film 410 with a passivation function of suppressing entrance of water or the like from the outside, a thickness t5 (see FIG. 27) of the light transmissive film 410 between the lower end 421 of the light-shielding part 420 and the upper surface of the antireflection film 407 is preferably 100 nm or more. If the thickness t5 is thin, hydrogen atoms can pass through the light transmissive film 410 between the lower end 421 of the light-shielding part 420 and the upper surface of the antireflection film 407, and can then be lost. If hydrogen atoms are lost, the sintering effect can lower to increase a dark current. From a viewpoint of suppressing transmission of the hydrogen atoms, the thickness t5 of the light transmissive film 410 between the lower end 421 of the light-shielding part 420 and the upper surface of the antireflection film 407 is preferably 200 nm or more, and more preferably 300 nm or more. On the other hand, if the thickness t5 is too thick, the possibility that light leaks between adjacent pixels becomes high, thereby increasing the possibility of occurrence of color mixing. Thus, from a viewpoint of suppressing light leakage (color mixing), the thickness t5 is preferably 800 nm or less, more preferably 500 nm or less, and still more preferably 400 nm or less. Therefore, the thickness t5 preferably satisfies 100 nm<t5<400 nm.

A method of manufacturing the photoelectric conversion apparatus 100 according to the fourth embodiment of the present invention will be described below with reference to FIGS. 13 to 17. In step S201, the plurality of photoelectric converters 402 can be formed in the light-receiving pixel region of the semiconductor layer 401. At this time, a plurality of photoelectric converters can also be formed in the light-shielded pixel region. Although not shown, in the semiconductor layer 401, floating diffusions (charge-voltage converters) and transistors such as transfer transistors each of which transfers a charge of the photoelectric converter to the floating diffusion can be formed. An electrical separation portion between elements such as transistors can be formed by a semiconductor region of the second conductivity type and/or an insulator (for example, STI (Shallow Trench Isolation)). The insulating film 406 and the wiring layers 403, 404, and 405 can be formed on the semiconductor layer 401 including the plurality of photoelectric converters 402 can be formed. Each of the wiring layers 403, 404, and 405 can be made of a metal material, for example, copper or aluminum. A portion of the insulating film 406, that covers the wiring layer 405 of the uppermost layer, can be planarized by a planarization process such as CMP.

The antireflection film (insulating film) 407 can be formed on the upper surface of the insulating film 406 to contact the upper surface. The light transmissive film 410 can be formed to contact the antireflection film 407. The light transmissive film 410 can be formed by depositing a high refractive index material, and processing the high refractive index material by photolithography and dry etching. More specifically, a photoresist film having a lens-shaped surface is formed on the high refractive index material, and the high refractive index material is etched via the photoresist film, thereby transferring the lens-shaped surface of the photoresist film to the high refractive index material. This can form the light transmissive film 410 including the intralayer lenses 411.

Next, the antireflection film (insulating film) 408 can be formed on the light transmissive film 410 to contact the light transmissive film 410. The light transmissive film 410 can be made of a compound containing silicon and nitrogen, and the antireflection film 408 can be made of a compound containing silicon and oxygen. In one example, the light transmissive film 410 can be made of a silicon nitride and the antireflection film 408 can be made of silicon oxide. In another example, the light transmissive film 410 can be made of silicon oxynitride and the antireflection film 408 can be made of silicon oxide. Next, the insulating film 430 can be formed to cover the antireflection film 408.

In step S202, a BARC film 450 and a photoresist film 451 can sequentially be formed on the antireflection film 408, and a groove 452 can be formed so that a bottomed opening is formed in the light transmissive film 410 by penetrating the insulating film 430 and the antireflection film 408. In this step, after the photoresist film 513 is patterned in a photolithography process, a two-stage dry etching process can be executed through the openings of the photoresist film 513. In dry etching at the first stage, the BARC film 450 can be etched. In dry etching at the second stage, the insulating film 430 and the antireflection film 408, and a portion of the light transmissive film 410 can be etched.

Dry etching at the first stage has, for example, a recipe in which an etching time is fixed, and only the BARC film 450 can be etched. Dry etching at the second stage has, for example, etching conditions that the etching rate of silicon oxide is 400 to 600 nm/min, the etching rate of silicon oxynitride is 150 to 350 nm/min, and the etching rate of silicon nitride is 50 to 250 nm/min.

In step S203, the groove 452 formed by dry etching is filled with a metal such as tungsten, thereby forming the light-shielding part 420. After the upper portion of the light-shielding part 420 is planarized by the planarization process such as CMP, a film made of the same material as that of the insulating film 430 can be formed as a cap film on the insulating film 430 and the light-shielding part 420.

Next, as shown in FIG. 13, the color filter layer 431 is formed on the cap film, and the microlenses 432 are formed on the color filter layer 431.

Figure 17:
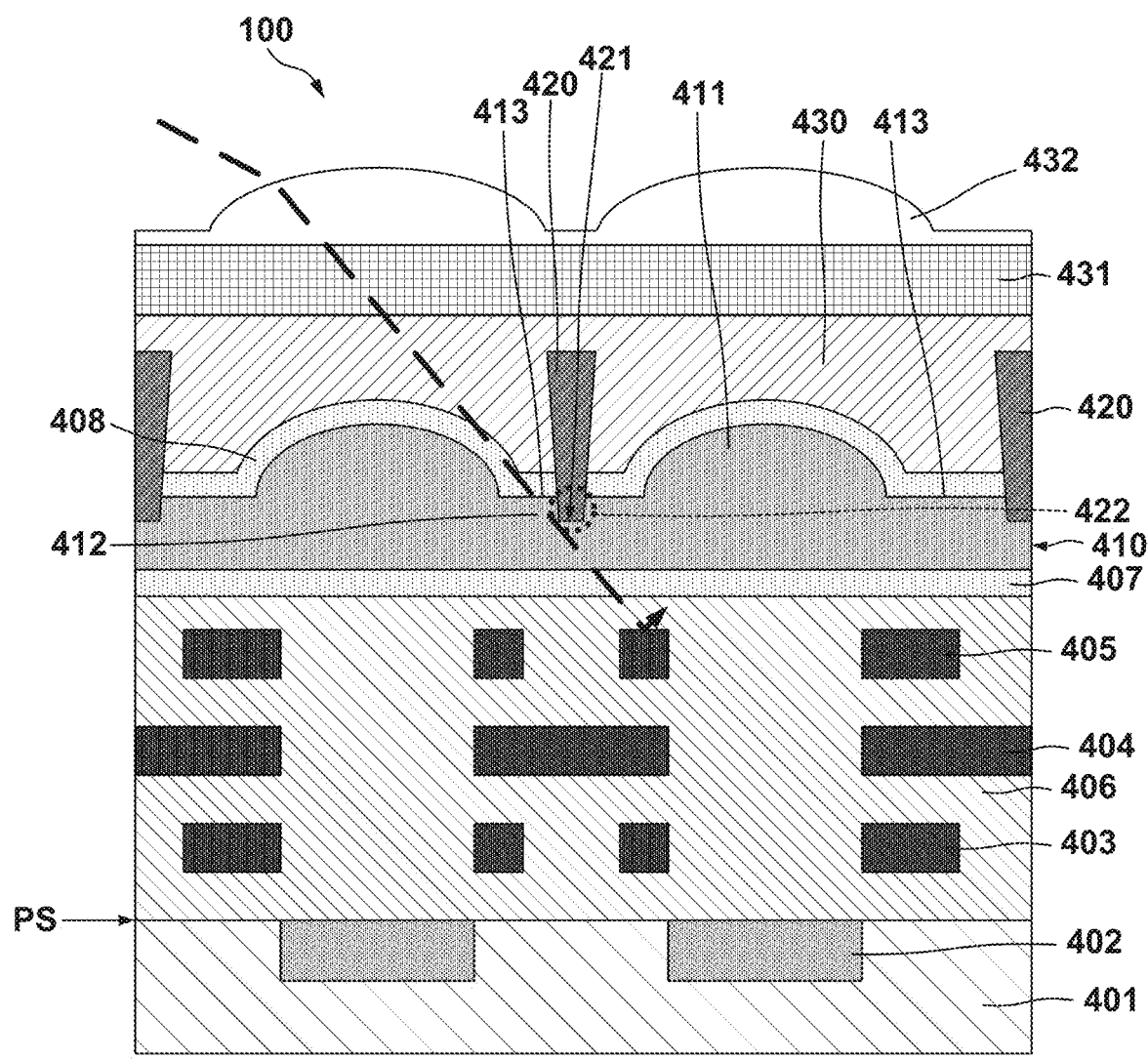
FIG. 17 is a sectional view showing the method of manufacturing the photoelectric conversion apparatus according to the fourth embodiment of the present invention.

FIG. 17 is a sectional view taken along a line D-D in FIG. 12 and showing the photoelectric conversion apparatus 100. In this example, since the light-shielding part 420 has a structure in a rectangular matrix, the distance between the intralayer lens 411 and the light-shielding part 420 is large in the diagonal direction (a corner portion) of each matrix element. Therefore, as indicated by a dotted arrow, light entering a pixel may leak outside the pixel.

Figure 18:
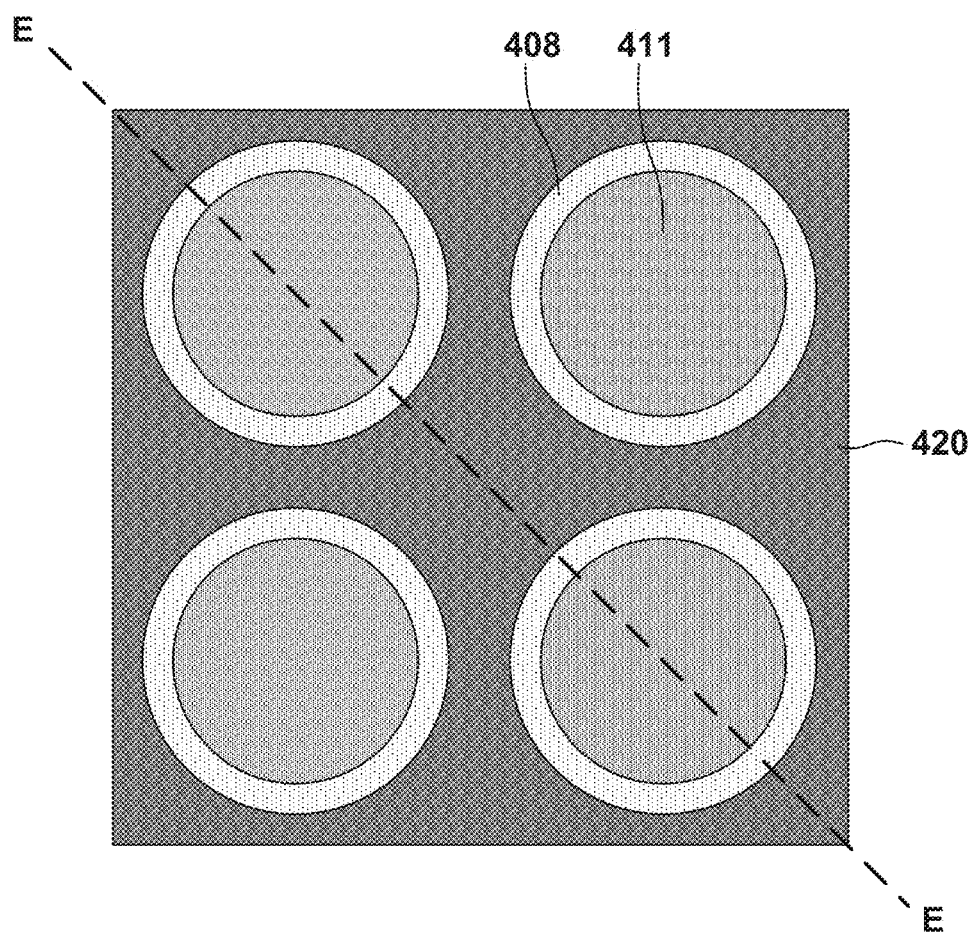
FIG. 18 is a plan view showing the arrangement of a photoelectric conversion apparatus according to the fifth embodiment of the present invention.
Figure 19:
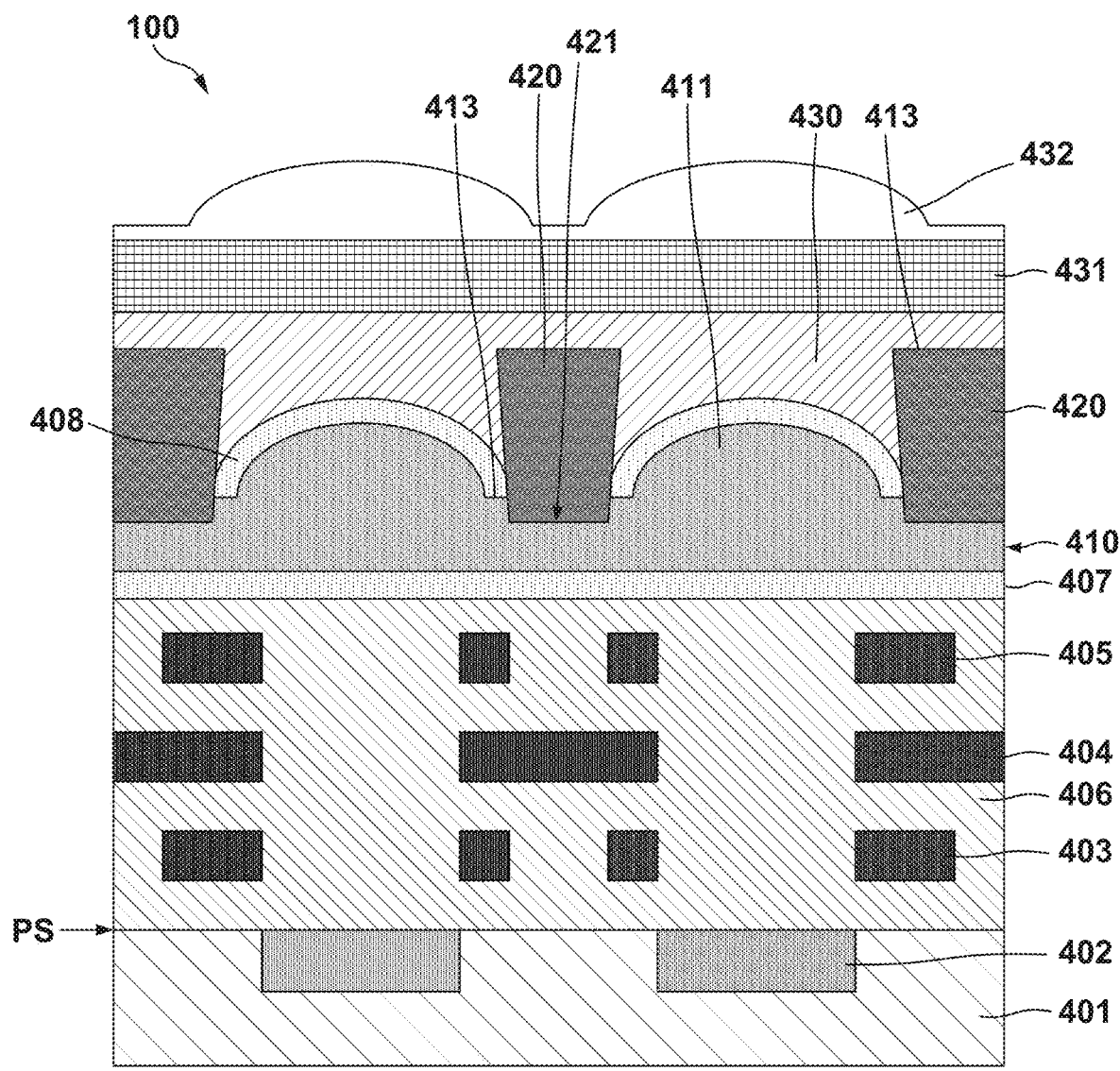
FIG. 19 is a sectional view showing the arrangement of the photoelectric conversion apparatus according to the fifth embodiment of the present invention.

FIGS. 18 and 19 show an improved example for reducing light leakage shown in FIG. 17. FIG. 18 is a plan view showing the arrangement of part of a photoelectric conversion apparatus 100 according to the fifth embodiment of the present invention, and shows a portion corresponding to a portion (four pixels) arranged in a light-receiving pixel region 101 shown in FIG. 1. FIG. 19 is a sectional view taken along a line E-E in FIG. 18 and showing the photoelectric conversion apparatus 100. Items which are not referred to as the fifth embodiment can comply with the fourth embodiment. In the fifth embodiment, a light-shielding part 420 includes openings (for example, circle) each along the outer shape of each intralayer lens 411, and the distance between each intralayer lens 411 and the light-shielding part 420 is constant. This structure is advantageous in reducing the possibility that light entering a pixel leaks outside the pixel. This can reduce the incidence of light beams, entering the light-receiving pixel region, on the photoelectric converters in the light-shielded pixel region, and also reduce entering of light from a pixel to another pixel.

Figure 20:
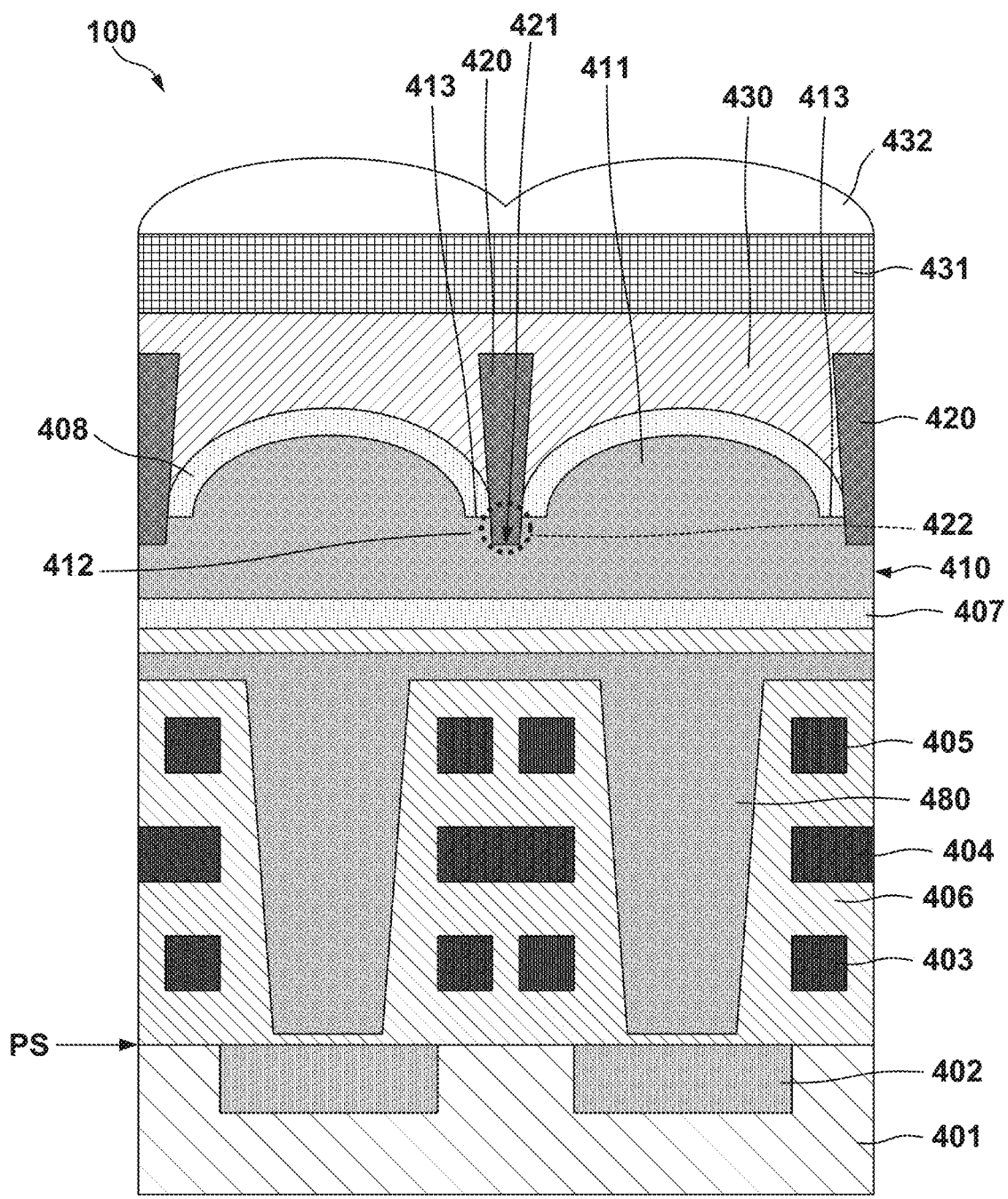
FIG. 20 is a sectional view showing the arrangement of a photoelectric conversion apparatus according to the sixth embodiment of the present invention.

FIG. 20 is a sectional view showing the arrangement of part of a photoelectric conversion apparatus 100 according to the sixth embodiment of the present invention. The sixth embodiment provides a modification of the fourth or fifth embodiment. The photoelectric conversion apparatus 100 according to the sixth embodiment includes light guides 480 between photoelectric converters 402 and intralayer lenses 411.

Figure 22:
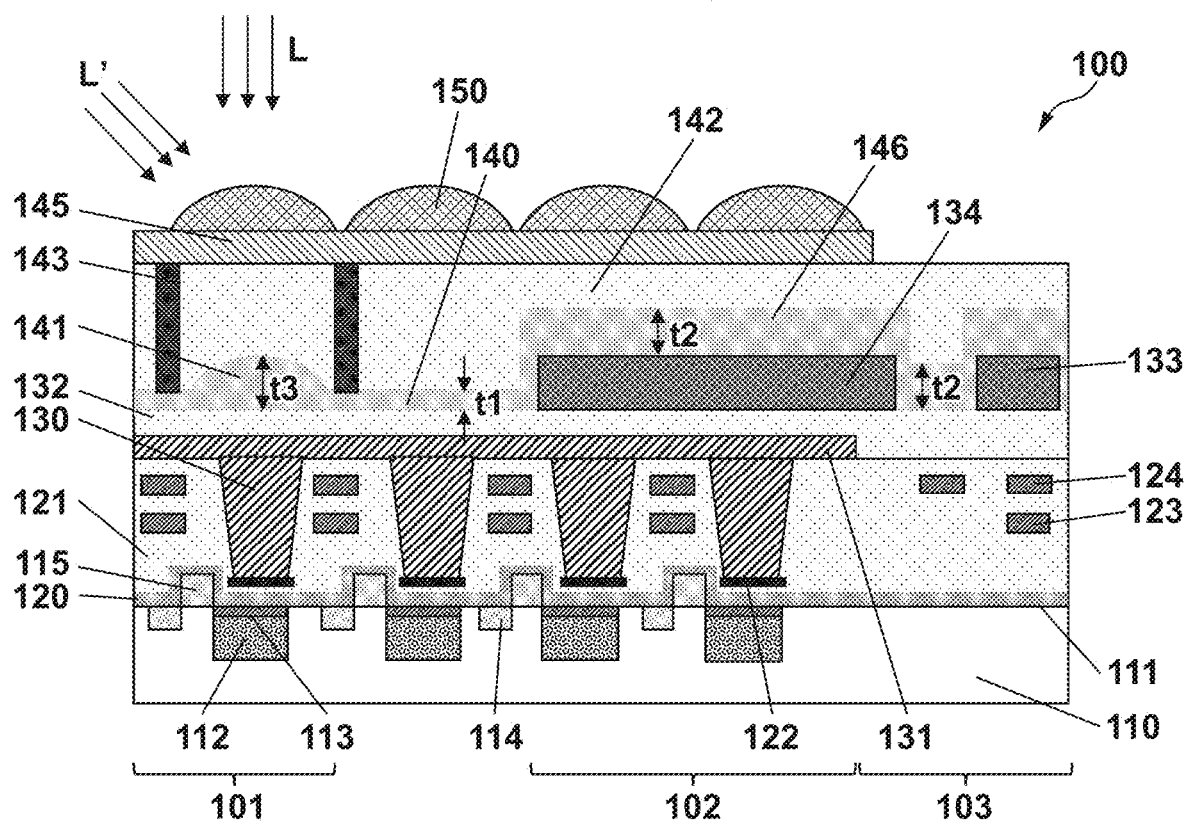
FIG. 22 is a sectional view showing the arrangement of a photoelectric conversion apparatus according to the seventh embodiment of the present invention.

The arrangement of a photoelectric conversion apparatus 100 according to the seventh embodiment of the present invention will be described below with reference to FIG. 22. Items which are not referred to as the seventh embodiment can comply with one of the first to sixth embodiments or a combination thereof. FIG. 22 is a sectional view showing the arrangement of part of the photoelectric conversion apparatus 100 according to the seventh embodiment of the present invention. A light transmissive film 140 as a silicon compound film made of a compound containing silicon and nitride includes an extension portion 146 extending from a light-receiving pixel region 101 to a light-shielded pixel region 102 and/or a peripheral circuit region 103. The light-shielded pixel region 102 and/or the peripheral circuit region 103 located outside the light-receiving pixel region 101 can collectively be referred to as a non-light-receiving pixel region.

The extension portion 146 covers a light-shielding film 134 and a third wiring layer 133. In the seventh embodiment, a thickness t2 of the extension portion 146 of the light transmissive film 140 extending to the light-shielded pixel region 102 and/or the peripheral circuit region 103 is larger than a thickness t1 of a portion, located in the light-receiving pixel region 101, of the light transmissive film 140. In other words, the light transmissive film 140 includes, in the light-receiving pixel region 101, a portion thinner than the extension portion 146 of the light transmissive film 140, that extends from the light-receiving pixel region 101 to the region (the non-light-receiving pixel region, that is, the light-shielded pixel region 102 and/or the peripheral circuit region 103) outside the light-receiving pixel region 101. The portion of the light transmissive film 140, that has the thickness t1 smaller than the thickness t2 in the light-receiving pixel region 101, can be a flat portion of the light transmissive film 140, that is located between the plurality of intralayer lenses 141, or a portion located between a light-shielding part 143 and a semiconductor layer 110.

If, as in the third embodiment, the flat portion located between the plurality of intralayer lenses 141 is thicker than the portion located between the light-shielding part 143 and the semiconductor layer 110, the thickness t2 of the extension portion 146 can be thicker than the portion located between the light-shielding part 143 and the semiconductor layer 110. In this case, the thickness t2 of the extension portion 146 is preferably larger than that of the flat portion. The light-shielding film 134 in the light-shielded pixel region 102 can be made of a material mainly containing aluminum. For the light-shielding film 134, aluminum alloy containing a small amount of copper, compared with aluminum, can be used instead of aluminum.

Since aluminum has a property of storing hydrogen and releasing hydrogen upon receiving heat, separation of hydrogen to the outside of an element increases in the light-shielded pixel region 102 and the peripheral circuit region 103 including the light-shielding film 134 and the third wiring layer 133, as compared with the light-receiving pixel region 101. In addition, separation of hydrogen to the outside of the element from a gap between the light-shielding film 134 and the third wiring layer 133 or a gap between a plurality of wiring patterns of the third wiring layer 133 can increase. On the other hand, the silicon compound that contains nitrogen and forms the light transmissive film 140 has a property of restricting transmission of hydrogen supplied from the insulating film 121 and the like arranged between the wiring layers. By arranging the thick extension portion 146 in the light-shielded pixel region 102 and the peripheral circuit region 103 arranged around the light-receiving pixel region 101 using the property, separation of hydrogen to the outside of the element in the light-shielded pixel region 102 and the peripheral circuit region 103 can be suppressed.

The thick extension portion 146 is preferably located on the light-shielding film 134 and/or the third wiring layer 133, and is also preferably located in the gap between the light-shielding film 134 and the third wiring layer 133 or the gap between the plurality of wiring patterns of the third wiring layer 133. This can suppress an increase in dark current in a peripheral region portion of the light-receiving pixel region 101 near the light-shielded pixel region 102. Furthermore, since the volume of the light transmissive film per area is small in the light-shielded pixel region 102 and the peripheral circuit region 103 where no intralayer lens 141 is formed, the extension portion 146 is preferably thick also in a portion including neither the light-shielding film 134 nor the third wiring layer 133. Since separation of hydrogen to the outside can be suppressed more as the light transmissive film 140 is thicker, the thickness is desirably uniform, and it is desirable that there is no step from a viewpoint of processing of a structure above the intralayer lenses. In the portion of the light-shielded pixel region 102 and the peripheral circuit region 103, that includes neither the light-shielding film 134 nor the third wiring layer 133, it is desirable to form a light transmissive film having a thickness equal to or larger than t2 from a viewpoint of suppressing separation of hydrogen to the outside.

From a viewpoint of suppressing separation of hydrogen to the outside of the element, the thickness t2 of the extension portion 146 is preferably thick, and is desirably 300 nm or more. The thickness t1 of the light transmissive film 140 is preferably 0.1 to 0.5 µm, and the thickness t2 of the extension portion 146 is preferably 0.5 to 2.5 µm and more preferably 0.5 to 1.5 m. From another viewpoint, the thickness t2 of the extension portion 146 is preferably larger than the thickness t1 of the light transmissive film 140, and is preferably, for example, five times or more the thickness t1 of the light transmissive film 140.

A thickness t3 (the thickness of a portion including the vertex of each intralayer lens 141) of each intralayer lens 141 may be equal to or smaller than the thickness t2 but is preferably larger than the thickness t1. The difference between t3 and t2 is preferably smaller than that between t1 and t2 (that is, $|t3-t2|<|t3-t1|$). By making the thickness t3 larger than the thickness t2, the power (light-condensing power) of the intralayer lens 141 can be improved. The intralayer lenses 141 can be formed by, for example, patterning a resist, forming a curved surface by reflowing the resist, and processing a lens material film by etch back using the reflowed resist. The reflowed resist is removed at the time of etch back. By leaving, in the light-shielded pixel region 102 and the peripheral circuit region 103, the resist used to form the intralayer lenses 141, it is possible to decrease the etching amount of the lens material film at the time of etch back, and leave the extension portion 146 having the sufficient thickness t2 in the light-shielded pixel region and the peripheral circuit region.

By reflow, the resist pattern for forming the intralayer lenses 141 has the curved surface, and thus the central portion has a large thickness. On the other hand, the resist pattern of the light-shielded pixel region 102 and the peripheral circuit region 103 is a solid film, and thus a change in film thickness caused by reflow is small. As a result, the resist pattern of the light-shielded pixel region 102 and the peripheral circuit region 103 is thinner than the resist pattern for forming the intralayer lenses 141. If the resist having such thickness relationship is etched back, the etching amount of the lens material film is larger in the light-shielded pixel region 102 and the peripheral circuit region 103 than in the light-receiving pixel region 101. As a result, t2 can be slightly smaller than t3.

Figure 23:
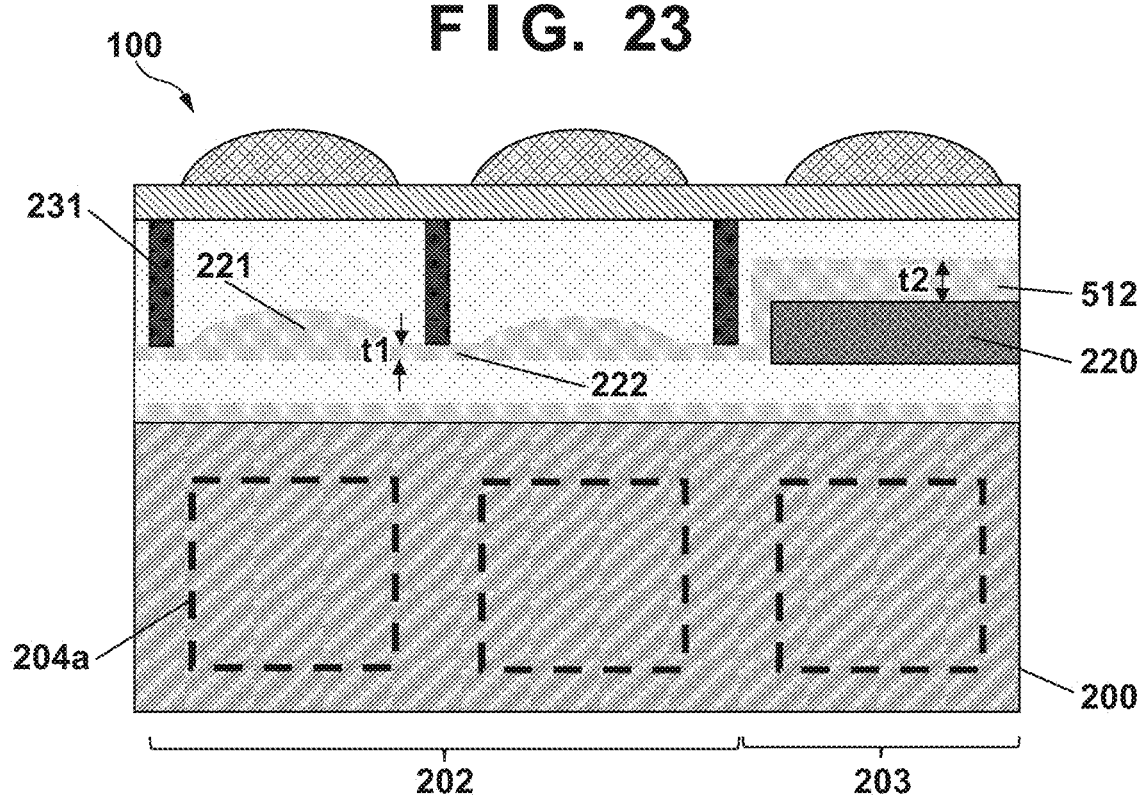
FIG. 23 is a sectional view showing the arrangement of a photoelectric conversion apparatus according to the eighth embodiment of the present invention.

The arrangement of a photoelectric conversion apparatus 100 according to the eighth embodiment of the present invention will be described below with reference to FIG. 23. Items which are not referred to as the eighth embodiment can comply with one of the first to seventh embodiments or a combination thereof, especially the second embodiment. FIG. 23 is a sectional view showing the arrangement of part of the photoelectric conversion apparatus 100 according to the eighth embodiment of the present invention. A light transmissive film 222 as a silicon compound film made of a compound containing silicon and nitride includes an extension portion 512 extending from a light-receiving pixel region 202 to a light-shielded pixel region 203 and/or a peripheral circuit region (not shown). The extension portion 512 covers a light-shielding film 220 and a wiring layer (not shown) in the peripheral circuit region. In the eighth embodiment, the arrangement according to the seventh embodiment, that is, the arrangement in which the thickness t2 of the extension portion 146 of the light transmissive film 140 in the light-shielded pixel region 102 and the peripheral circuit region 103 is larger than the thickness t1 of the light transmissive film 140 in the light-receiving pixel region 101 is applied to the photoelectric conversion apparatus 100 according to the second embodiment. In the photoelectric conversion apparatus 100 according to the eighth embodiment, as shown in FIG. 23, a thickness t2 of the extension portion 512 of the light transmissive film 222 in the light-shielded pixel region 203 and the peripheral circuit region (not shown) is larger than a thickness t1 of the light transmissive film 222 in the light-receiving pixel region 202.

The photoelectric conversion apparatus 100 according to the eighth embodiment can be manufactured by changing the mask pattern from the second embodiment to leave the resist in the light-shielded pixel region and the peripheral circuit region when forming intralayer lenses 221 in step S107.

Figure 24:
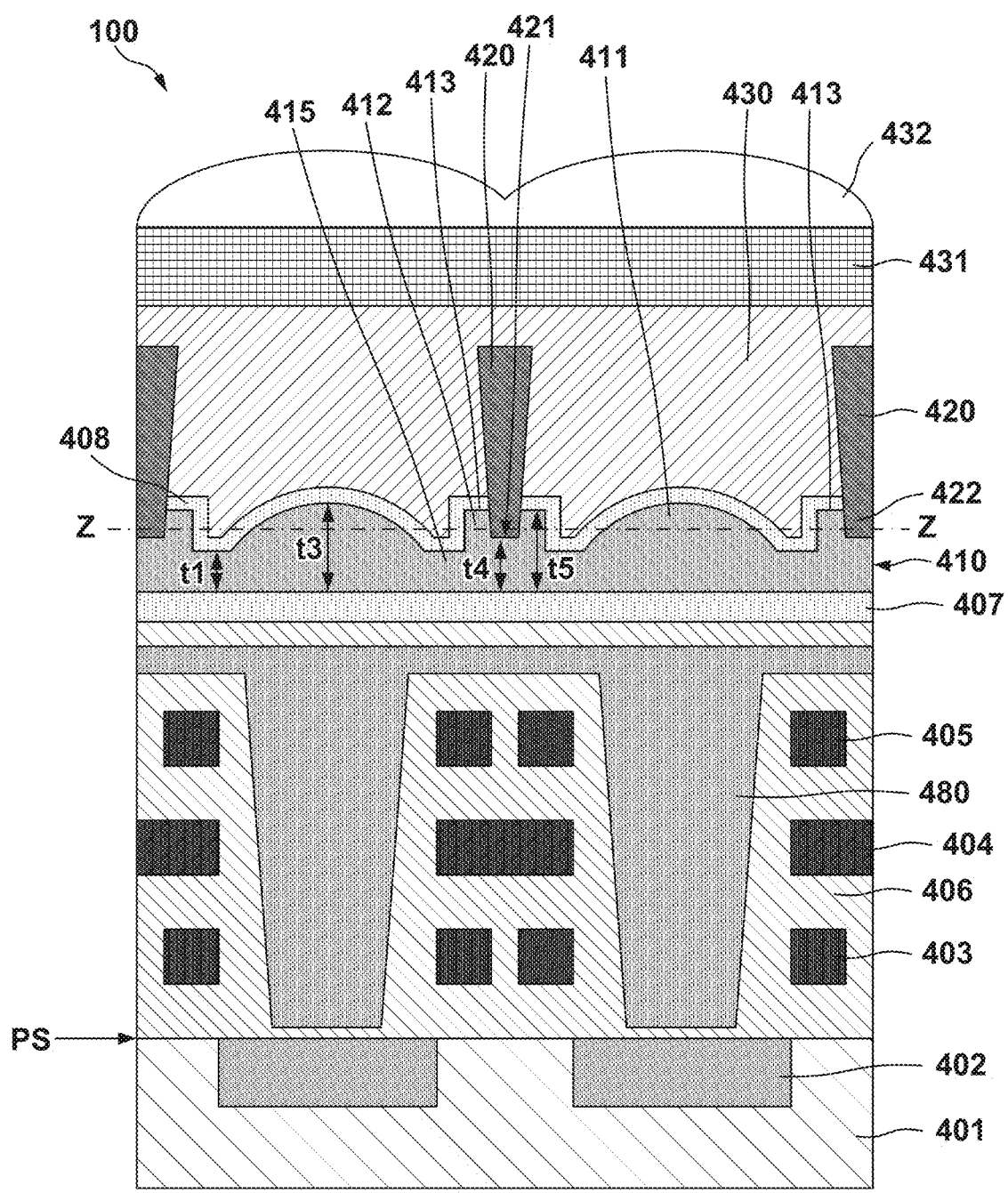
FIG. 24 is a sectional view showing the arrangement of a photoelectric conversion apparatus according to the ninth embodiment of the present invention.
Figure 25:
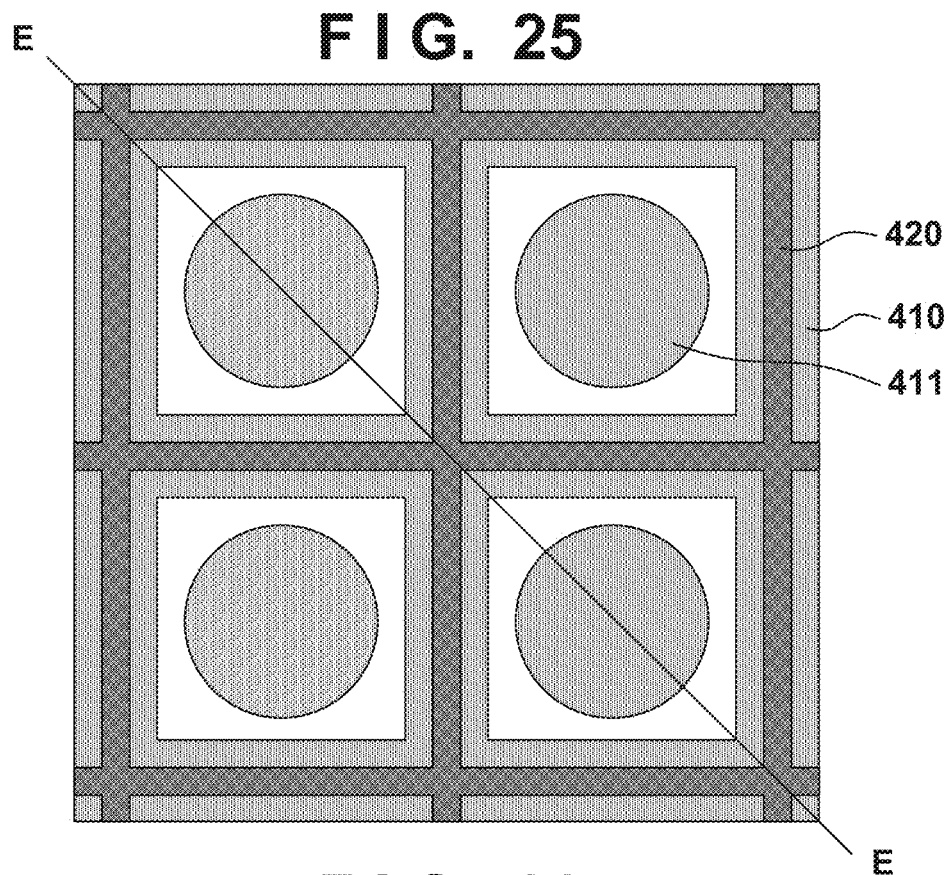
FIG. 25 is a cross-sectional view taken along a line Z-Z in FIG. 24.
Figure 26:
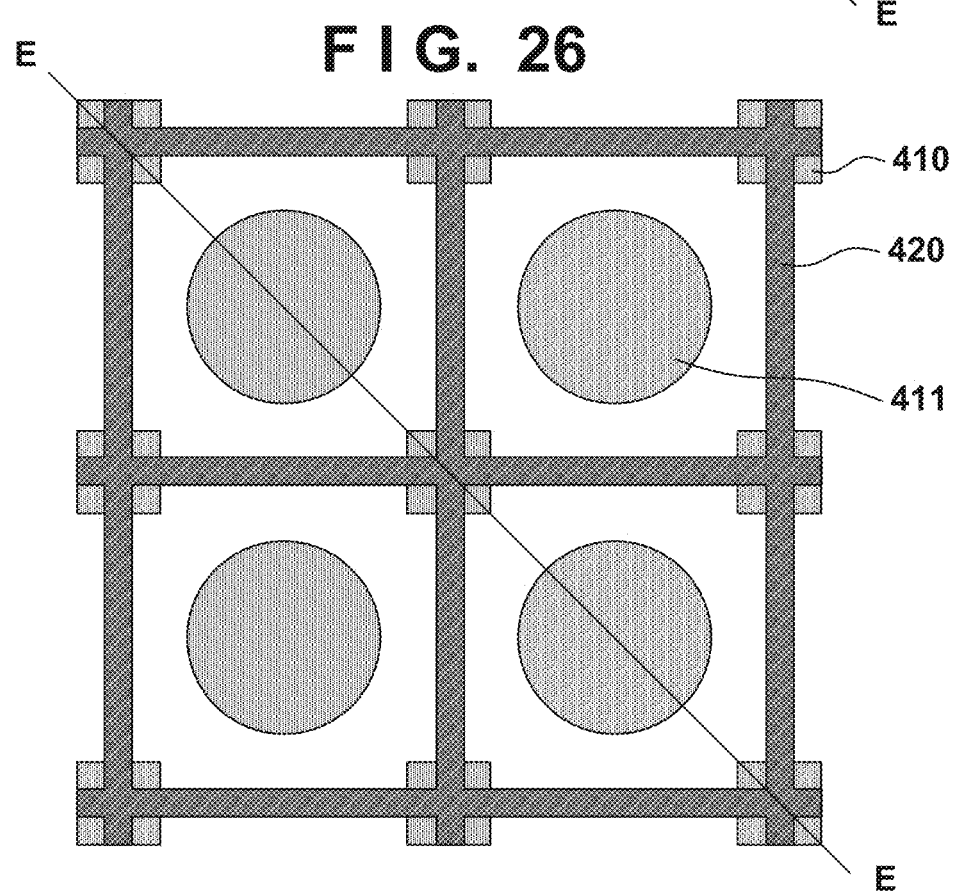
FIG. 26 is a cross-sectional view taken along the line Z-Z in FIG. 24.

The arrangement of a photoelectric conversion apparatus 100 according to the ninth embodiment of the present invention will be described below with reference to FIGS. 24, 25, and 26. Items which are not referred to as the ninth embodiment can comply with one of the first to eighth embodiments or a combination thereof. FIG. 24 is a sectional view showing the arrangement of part of the photoelectric conversion apparatus 100 according to the ninth embodiment of the present invention (a sectional view taken along a line E-E in FIG. 25 or 26). FIG. 25 is an example of a cross-sectional view taken along a line Z-Z in FIG. 24, and FIG. 26 is another example of the cross sectional view taken along the line Z-Z in FIG. 24.

A light transmissive film 410 as a silicon compound film made of a compound containing silicon and nitride can include a flat portion 412 having a flat upper surface 413. The flat portion 412 has a thickness t5. A lower end 421 of a light-shielding part 420 can be lower than the upper surface 413 of the flat portion 412, and the side surface of a lower portion 422 of the light-shielding part 420 can be surrounded by the flat portion 412. The flat portion 412 can be arranged among a plurality of intralayer lenses 411. In one example, the width of the lower end of the light-shielding part 420 is smaller than that of the upper end of the light-shielding part 420. This structure can be implemented by, for example, forming a groove in an insulating film 430 by etching, and filling the groove with a light-shielding material to form the light-shielding part 420. The light-shielding part 420 can be arranged to penetrate an antireflection film 408 that covers the light transmissive film 410 (insulator) while contacting the light transmissive film 410.

A concave portion 415 is arranged between the flat portion 412 and the intralayer lenses 411. Let t3 be the thickness (the thickness of a portion including the vertex of each intralayer lens 411) of each intralayer lens 411. Let t1 be the thickness of the concave portion 415. The lower end 421 of the light-shielding part 420 can be lower than the upper surface 413 of the flat portion 412, and the side surface of the lower portion 422 of the light-shielding part 420 can be surrounded by the flat portion 412. In other words, the lower end 421 of the light-shielding part 420 is arranged to pierce the flat portion 412. The light transmissive film 410 has a thickness t4 between the lower end 421 of the light-shielding part 420 and an antireflection film 407. The thicknesses t1, t3, t4, and t5 preferably satisfy t1<t4<t5<t3.

If, from a viewpoint of improving the light-shielding performance, the thickness t4 of the light transmissive film 410 between the lower end 421 of the light-shielding part 420 and the antireflection film 407 is thinned, separation of hydrogen to the outside of the element can be induced. Although separation of hydrogen can be suppressed by setting t1=t4 and thickening an overall light transmissive film 410, light entering the light transmissive film 410 leaks to an adjacent pixel through the light transmissive film 410, thereby increasing color mixing. In addition, since the thickness of the light transmissive film 410 on the light path becomes thick, the optical path length becomes long, thereby decreasing the light efficiency. To avoid this, the light transmissive film 410 is preferably thickened by the thickness of the flat portion 412 arranged between the intralayer lenses 411. The flat portion 412 need not be provided for all the intralayer lenses 411, and the flat portion 412 may be arranged only in a region where the influence of separation of hydrogen to the outside is large, that is, the peripheral portion of the light-receiving pixel region. The thickness t4 desirably falls within, for example, the range of 200 nm to 500 nm from a viewpoint of suppressing separation of hydrogen and ensuring the power (light-condensing power) of the intralayer lens.

From a viewpoint of light shielding, the thickness t4 of the light transmissive film 410 between the lower end 421 of the light-shielding part 420 and the antireflection film 407 is desirably thin. However, if the thickness t4 of the light transmissive film 410 between the lower end 421 of the light-shielding part 420 and the antireflection film 407 is small, separation of hydrogen to the outside of the element advances. Thus, the thickness t4 is preferably 100 nm or more. To effectively suppress separation of hydrogen to the outside of the element, the thickness t4 preferably falls within the range of 200 nm to 800 nm. However, to suppress color mixing caused when light entering the light transmissive film 410 leaks to the adjacent pixel through the light transmissive film 410, the thickness t4 is preferably 500 nm or less. The thicknesses t1, t5, and t4 preferably satisfy t1<t4<t5. Note that light guides 480 are arbitrary components.

Figure 21:
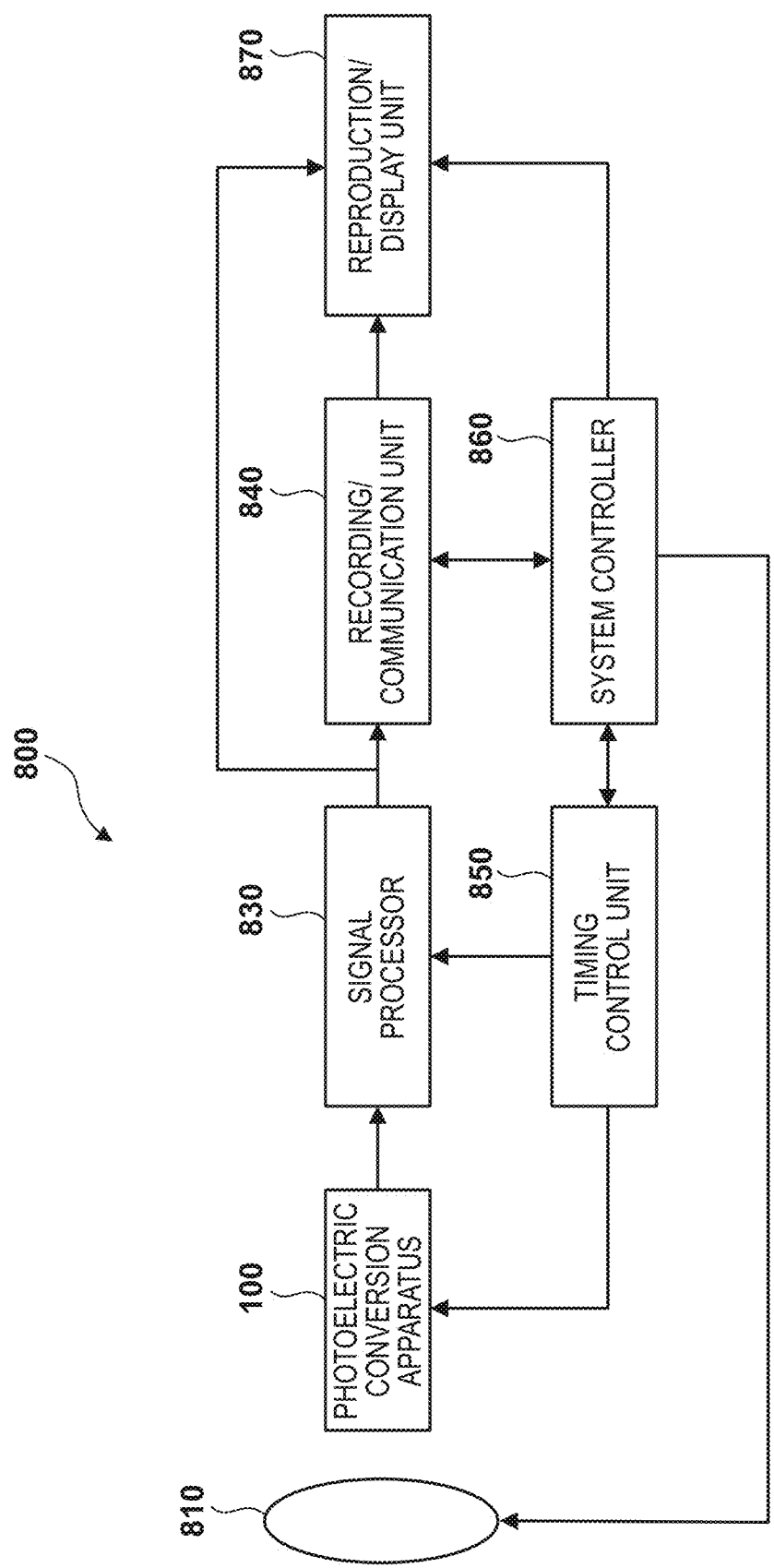
FIG. 21 is a view showing an example of the arrangement of an equipment.

An equipment 800 according to one embodiment of the present invention will be described below with reference to FIG. 21. The equipment 800 includes the above-escribed photoelectric conversion apparatus. The photoelectric conversion apparatus in the equipment 800 can perform not only shooting but also photoelectrical conversion for focus detection, distance measurement, photometry, and the like. The equipment conceptually includes not only an apparatus whose principal purpose is photoelectrical conversion or shooting but also an equipment additionally provided with a photoelectrical conversion or shooting function. Examples of the equipment 800 are an electronic equipment such as a camera, personal computer, or mobile terminal, a transportation equipment such as an automobile, ship, or airplane, a medical equipment such as an endoscope or radiation diagnostic apparatus, and an analysis equipment using energy rays. The equipment includes the photoelectric conversion apparatus according to the present invention exemplified as each of the above embodiments, and a processor that processes a signal (image) output from the photoelectric conversion apparatus. The processor can include a processor that processes a signal output from the photoelectric conversion apparatus.

The equipment 800 includes, for example, an optical system 810, a photoelectric conversion apparatus 100, a signal processor (processor) 830, a recording/communication unit 840, a timing control unit 850, a system controller 860, and a reproduction/display unit 870. An image of an object and the optical system 810 are formed in the pixel array of the photoelectric conversion apparatus 100. The photoelectric conversion apparatus 100 outputs an image by performing an image capturing operation in accordance with a signal from the timing control unit 850. The image output from the photoelectric conversion apparatus 100 is provided to the signal processor 830.

The signal processor 830 processes the signal provided from the photoelectric conversion apparatus 100, and provides it to the recording/communication unit 840. The recording/communication unit 840 sends the image to the reproduction/display unit 870 to reproduce and display the image. The recording/communication unit 840 records the image in a recording medium (not shown).

The timing control unit 850 controls the driving timing of the photoelectric conversion apparatus 100 and the signal processor 830 under the control of the system controller 860. The system controller 860 comprehensively controls the operation of the equipment 800, and controls driving of the optical system 810, the timing control unit 850, the recording/communication unit 840, and the reproduction/display unit 870. The system controller 860 includes, for example, a storage apparatus (not shown) to record a program and the like necessary to control the operation of the image capturing system. The system controller 860 sets, for example, a mode in accordance with an operation performed by the user.

The above-described embodiments can be changed appropriately without departing from the technical concept. For example, a plurality of embodiments may be combined, a given embodiment may be replaced by another embodiment, or some items of a given embodiment may be deleted. Note that contents disclosed in this specification include not only contents described in this specification but also all items that can be grasped from the accompanying drawings of this specification. The contents disclosed in this specification include a complementary set of concepts described in this specification. That is, if, for example, "A is larger than B" is described in this specification, this specification is considered to disclose "A is not larger than B" even if a description of "A is not larger than B" is omitted. This is because if "A is larger than B" is described, it is assumed that a case in which "A is not larger than B" has been considered.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-196075 filed Oct. 17, 2018 and Japanese Patent Application No. 2019-126402 filed Jul. 5, 2019, which are hereby incorporated by reference herein in their entirety.

What is claimed is:

1. A photoelectric conversion apparatus including a light-receiving region and a light-shielded region, comprising:
   a semiconductor layer including a plurality of photoelectric converters provided in the light-receiving region and a plurality of photoelectric converters provided in the light-shielded region;
   a light-shielding part arranged above the semiconductor layer in the light-receiving region to surround light paths of light beams respectively entering the plurality of photoelectric converters provided in the light-receiving region; and
   a light-shielding film arranged above the semiconductor layer in the light-shielded region to cover the plurality of photoelectric converters provided in the light-shielded region,
   wherein the light-shielding part includes a lower end that is an end on a side of the semiconductor layer in a direction perpendicular to a principal surface of the semiconductor layer and an upper end that is an end on an opposite side of the lower end of the light-shielding part in the perpendicular direction,
   the light-shielding film includes a lower surface that is a surface on the side of the semiconductor layer in the perpendicular direction and an upper surface that is a surface on an opposite side of the semiconductor layer in the perpendicular direction, and the lower surface is along the principal surface of the semiconductor layer to face the plurality of photoelectric converters provided in the light-shielded region,
   a distance between the upper end of the light-shielding part and the semiconductor layer is larger than a distance between the upper surface of the light-shielding film and the semiconductor layer, and
   a distance between the lower end of the light-shielding part and the semiconductor layer is smaller than the distance between the upper surface of the light-shielding film and the semiconductor layer, and is larger than a distance between the lower surface of the light-shielding film and the semiconductor layer.

2. The apparatus according to claim 1, further comprising:
   a plurality of light guides arranged in the light paths of the light beams respectively entering the plurality of photoelectric converters provided in the light-receiving region; and
   a coupling portion spreading to interconnect the plurality of light guides,
   wherein the light-shielding part is arranged above the coupling portion.

3. A photoelectric conversion apparatus including a light-receiving region and a light-shielded region, comprising:
   a semiconductor layer including a plurality of photoelectric converters provided in the light-receiving region and a plurality of photoelectric converters provided in the light-shielded region;
   a light-shielding part arranged above the semiconductor layer in the light-receiving region to surround light paths of light beams respectively entering the plurality of photoelectric converters provided in the light-receiving region;
   a light-shielding film arranged above the semiconductor layer in the light-shielded region to cover the plurality of photoelectric converters provided in the light-shielded region;
   a plurality of light guides arranged in light paths of light beams respectively entering the plurality of photoelectric converters provided in the light-shielded region; and
   a coupling portion spreading to interconnect the plurality of light guides and extending from the light-receiving region to the light-shielding film,
   wherein the light-shielding part includes a lower end that is an end on a side of the semiconductor layer in a direction perpendicular to a principal surface of the semiconductor layer and an upper end that is an end on an opposite side of the lower end of the light-shielding part in the perpendicular direction,
   the light-shielding film includes a lower surface that is a surface on the side of the semiconductor layer in the perpendicular direction and an upper surface that is a surface on an opposite side of the semiconductor layer in the perpendicular direction, and the lower surface is along the principal surface of the semiconductor layer to face the plurality of photoelectric converters provided in the light-shielded region,
the light-shielding part is arranged above the coupling portion,
a distance between the upper end of the light-shielding part and the semiconductor layer is larger than a distance between the upper surface of the light-shielding film and the semiconductor layer, and
a distance between the lower end of the light-shielding part and the semiconductor layer is smaller than the distance between the upper surface of the light-shielding film and the semiconductor layer.

4. The apparatus according to claim 1, wherein
the light-shielding part has a structure continuous from the lower end of the light-shielding part to the upper end of the light-shielding part, and
the light-shielding film has a structure continuous from the lower surface of the light-shielding film to the upper surface of the light-shielding film.

5. The apparatus according to claim 1, wherein a distance between the lower end and the upper end of the light-shielding part is larger than a thickness of the light-shielding film.

6. The apparatus according to claim 1, wherein in a cross section that is orthogonal to the principal surface of the semiconductor layer and includes some of the plurality of photoelectric converters provided in the light-receiving region, a width of the light-shielding part in a direction parallel to the principal surface is not larger than 0.5 μm.

7. The apparatus according to claim 1, further comprising a compound film arranged above the semiconductor layer over the light-receiving region and the light-shielded region and made of a compound containing silicon and nitrogen,
wherein the compound film is located between the light-shielding part and the semiconductor layer in the light-receiving region, and the light-shielding film is located between the compound film and the semiconductor layer in the light-shielded region.

8. The apparatus according to claim 7, wherein a distance between a lower surface of the compound film and the semiconductor layer in the light-receiving region is smaller than the distance between the upper surface of the light-shielding film and the semiconductor layer.

9. The apparatus according to claim 7, wherein the compound film includes a plurality of intralayer lenses respectively arranged in the light paths of the light beams respectively entering the plurality of photoelectric converters provided in the light-receiving region.

10. The apparatus according to claim 1, further comprising an intralayer lens layer arranged above the semiconductor layer,
the intralayer lens layer including a plurality of intralayer lenses arranged in the light paths of the light beams respectively entering the plurality of photoelectric converters provided in the light-receiving region,
wherein a distance between the semiconductor layer and an upper surface of a portion located between the plurality of intralayer lenses of the intralayer lens layer in the light-receiving region is smaller than the distance between the upper surface of the light-shielding film and the semiconductor layer.

11. The apparatus according to claim 9, wherein a distance between the semiconductor layer and a vertex of each of the plurality of intralayer lenses in the light-receiving region is smaller than the distance between the upper surface of the light-shielding film and the semiconductor layer.

12. The apparatus according to claim 1, further comprising:
a wiring layer arranged above the semiconductor layer in the light-receiving region and the light-shielded region; and
an insulating film arranged between the wiring layer and the light-shielding part and the light-shielding film.

13. The apparatus according to claim 1, further comprising:
a wiring layer arranged above an opposite side of the light-shielding part and the light-shielding film with respect to the semiconductor layer.

14. The apparatus according to claim 1, wherein the light-shielding part has a matrix structure.

15. The apparatus according to claim 1, wherein
the plurality of photoelectric converters provided in the light-receiving region are arranged to form a plurality of rows and a plurality of columns, and signals of the photoelectric converters of each column are output via a column signal line,
the light-shielding part includes a plurality of portions electrically insulated from each other,
each of the light paths of the light beams respectively entering the plurality of photoelectric converters provided in the light-receiving region is surrounded by four portions of the plurality of portions of the light-shielding part, and
each of the plurality of portions corresponds to one column and is continuous without being divided.

16. The apparatus according to claim 1, wherein the photoelectric conversion apparatus is configured to apply a fixed potential to the light-shielding part.

17. A photoelectric conversion apparatus comprising:
a semiconductor layer including a plurality of photoelectric converters;
a light-shielding part including a metal arranged to surround light paths of light beams respectively entering the plurality of photoelectric converters; and
a compound film arranged between the semiconductor layer and the light-shielding part and made of a compound containing silicon and nitrogen,
the light-shielding part including a lower end that is an end on a side of the semiconductor layer in a direction perpendicular to a principal surface of the semiconductor layer and an upper end that is an end on an opposite side of the lower end of the light-shielding part in the perpendicular direction, and
the compound film including a lower surface that is a surface on the side of the semiconductor layer in the perpendicular direction and an upper surface that is a surface on an opposite side of the semiconductor layer in the perpendicular direction, the upper surface of the compound film including a flat portion,
the compound film including a plurality of intralayer lenses arranged in the light paths of the light beams respectively entering the plurality of photoelectric converters, and the flat portion being arranged between the plurality of intralayer lenses,
wherein a distance between the upper end of the light-shielding part and the semiconductor layer is larger than a distance between a vertex of an intralayer lens of the plurality of photoelectric converters and the semiconductor layer, and
wherein a distance between the lower end of the light-shielding part and the semiconductor layer is smaller than a distance between the flat portion of the upper surface of the compound film and the semiconductor layer, and is larger than a distance between the lower surface of the compound film and the semiconductor layer.

18. The apparatus according to claim 17, wherein
the compound film includes a silicon oxynitride layer, and a silicon nitride layer located between the silicon oxynitride layer and the semiconductor layer, and
the light-shielding part penetrates the silicon oxynitride layer to contact the silicon nitride layer.

19. The apparatus according to claim 18, wherein the distance between the lower end of the light-shielding part and the semiconductor layer is smaller than a distance between a lower face of the silicon oxynitride layer and the semiconductor layer.

20. The apparatus according to claim 1, wherein a width of the lower end of the light-shielding part is smaller than a width of the upper end of the light-shielding part.

21. The apparatus according to claim 7, wherein in the light-receiving region, the compound film includes a portion thinner than a portion, of the compound film, extending from the light-receiving region to a region outside the light-receiving region.

22. The apparatus according to claim 9, wherein
the compound film includes a portion arranged between the light-shielding part and the semiconductor layer in the light-receiving region and an extension portion extending from the light-receiving region to a region outside the light-receiving region, and
when t1 represents a thickness of the portion of the compound film in the light-receiving region, t2 represents a thickness of the extension portion, and t3 represents a thickness of the intralayer lenses, $$|t3-t2|<|t3-t1|$$

is satisfied.

23. The apparatus according to claim 7, wherein
the compound film includes a portion arranged between the light-shielding part and the semiconductor layer, and
a thickness of the portion of the compound film falls within a range from 100 nm to 400 nm.

24. The apparatus according to claim 9, wherein
the compound film includes a first portion arranged between the plurality of intralayer lenses and between the light-shielding part and the semiconductor layer, and a second portion arranged between the first portion and one of the plurality of intralayer lenses, and
when t4 represents a thickness of the first portion, t1 represents a thickness of the second portion, and t3 represents a thickness of the intralayer lenses, $$t1<t4<t3$$

is satisfied.

25. An equipment comprising:
a photoelectric conversion apparatus defined in claim 1; and
a processor configured to process a signal output from the photoelectric conversion apparatus.

* * * * *